(12) United States Patent
Kanskar et al.

(10) Patent No.: US 9,705,289 B2
(45) Date of Patent: Jul. 11, 2017

(54) HIGH BRIGHTNESS MULTIJUNCTION DIODE STACKING

(71) Applicant: NLIGHT, INC., Vancouver, WA (US)

(72) Inventors: Manoj Kanskar, Portland, OR (US); Raymond Kirk Price, Redmond, WA (US); Jay Small, Vancouver, WA (US); David Martin Hemenway, Beaverton, WA (US); Zhigang Chen, Portland, OR (US)

(73) Assignee: NLIGHT, INC., Vancouver, WA (US)

( * ) Notice: Subject to any disclaimer, the term of this patent is extended or adjusted under 35 U.S.C. 154(b) by 0 days.

(21) Appl. No.: 14/984,602

(22) Filed: Dec. 30, 2015

(65) Prior Publication Data

US 2016/0181764 A1 Jun. 23, 2016

Related U.S. Application Data

(63) Continuation-in-part of application No. 14/641,093, filed on Mar. 6, 2015.

(Continued)

(51) Int. Cl.
*G02B 27/30* (2006.01)
*H01S 5/40* (2006.01)
(Continued)

(52) U.S. Cl.
CPC .............. *H01S 5/4012* (2013.01); *G02B 5/09* (2013.01); *G02B 5/10* (2013.01); *G02B 6/4204* (2013.01);
(Continued)

(58) Field of Classification Search
CPC . G02B 27/30; G02B 5/10; G02B 5/09; G02B 6/4204; G02B 6/4296;
(Continued)

(56) References Cited

U.S. PATENT DOCUMENTS 3,622,906 A 11/1971 Nyul
3,827,059 A 7/1974 Rambauske
(Continued)

FOREIGN PATENT DOCUMENTS

CN 1829015 9/2006
CN 1975507 6/2007
(Continued)

OTHER PUBLICATIONS

Edwin, "Stripe Stacker for Use with Laser Diode Bars," Optics Letters, 20-222-224 (Jan. 15, 1995).
(Continued)

*Primary Examiner* — Scott J Sugarman
*Assistant Examiner* — Mustak Choudhury
(74) *Attorney, Agent, or Firm* — Birdwell & Janke, LLP

(57) ABSTRACT

An apparatus includes at least one multijunction diode laser situated to emit a plurality of beams along respective mutually parallel propagation axes, each beam having an associated mutually parallel slow axes and associated collinear fast axes, a fast axis collimator situated to receive and collimate the plurality of beams along the corresponding fast axes so as to produce corresponding fast axis collimated beams that propagate along associated non-parallel axes, and a reflector situated to receive the plurality of fast axis collimated beams and to reflect the beams so that the reflected fast axis collimated beams propagate along substantially parallel axes.

19 Claims, 17 Drawing Sheets

Related U.S. Application Data

(60) Provisional application No. 61/949,224, filed on Mar. 6, 2014.

(51) Int. Cl.
*H01S 5/022* (2006.01)
*G02B 6/42* (2006.01)
*G02B 5/09* (2006.01)
*G02B 5/10* (2006.01)
*H01S 3/08* (2006.01)

(52) U.S. Cl.
CPC .......... *G02B 6/4296* (2013.01); *G02B 27/30* (2013.01); *H01S 5/02284* (2013.01); *H01S 5/4043* (2013.01); *H01S 5/4062* (2013.01); *H01S 3/08059* (2013.01); *H01S 5/02248* (2013.01)

(58) Field of Classification Search
CPC .. H01S 5/4062; H01S 5/4043; H01S 5/02248; H01S 5/02284; H01S 3/3054; H01S 5/4031; H01S 3/08059
USPC ....... 359/641, 618, 625, 619, 621, 719, 372, 359/385; 372/50.12, 99, 101, 107; 385/33, 146
See application file for complete search history.

(56) References Cited

U.S. PATENT DOCUMENTS

| | | | |
|---|---|---|---|
| 4,550,333 A | 10/1985 | Ridder et al. | |
| 4,689,482 A | 8/1987 | Horikawa et al. | |
| 4,716,568 A | 12/1987 | Scifres et al. | |
| 4,719,631 A | 1/1988 | Conaway | |
| 4,828,357 A | 5/1989 | Arata et al. | |
| 5,048,911 A | 9/1991 | Sang et al. | |
| 5,077,750 A | 12/1991 | Pocholle et al. | |
| 5,105,430 A | 4/1992 | Mundinger et al. | |
| 5,168,401 A | 12/1992 | Endriz | |
| 5,305,344 A | 4/1994 | Patel | |
| 5,319,528 A | 6/1994 | Raven | |
| 5,515,391 A | 5/1996 | Endriz | |
| 5,610,930 A | 3/1997 | Macomber et al. | |
| 5,668,822 A | 9/1997 | Tada | |
| 5,764,675 A | 6/1998 | Juhala | |
| 5,825,551 A | 10/1998 | Clarkson et al. | |
| 5,828,683 A | 10/1998 | Freitas | |
| 5,887,096 A | 3/1999 | Du et al. | |
| 5,898,211 A | 4/1999 | Marshall et al. | |
| 5,909,458 A | 6/1999 | Freitas et al. | |
| 5,986,794 A | 11/1999 | Krause et al. | |
| 5,987,043 A | 11/1999 | Brown et al. | |
| 6,028,722 A | 2/2000 | Lang | |
| 6,044,096 A | 3/2000 | Wolak et al. | |
| 6,057,871 A | 5/2000 | Peterson | |
| 6,075,912 A | 6/2000 | Goodman | |
| 6,115,185 A | 9/2000 | Du et al. | |
| 6,124,973 A | 9/2000 | Du et al. | |
| 6,229,831 B1 | 5/2001 | Nightingale et al. | |
| 6,240,116 B1 | 5/2001 | Lang et al. | |
| 6,266,359 B1 | 7/2001 | Taheri et al. | |
| 6,324,320 B1 | 11/2001 | Goodman | |
| 6,327,285 B1 | 12/2001 | Wang | |
| 6,377,410 B1 | 4/2002 | Wang et al. | |
| 6,462,883 B1 | 10/2002 | Wang et al. | |
| 6,552,853 B2 | 4/2003 | Goodman | |
| 6,556,352 B2 | 4/2003 | Wang et al. | |
| 6,636,538 B1 | 10/2003 | Stephens | |
| 6,673,699 B2 | 1/2004 | Hubbard et al. | |
| 6,680,800 B1 | 1/2004 | Schreiber et al. | |
| 6,683,727 B1 | 1/2004 | Goring et al. | |
| 6,700,709 B1 | 3/2004 | Fermann | |
| 6,710,926 B2 | 3/2004 | Beach et al. | |
| 6,765,725 B1 | 7/2004 | Fermann et al. | |
| 6,778,732 B1 | 8/2004 | Fermann | |
| 6,898,222 B2 | 5/2005 | Hennig et al. | |
| 6,975,659 B2 | 12/2005 | Nagano et al. | |
| 7,420,996 B2 | 9/2008 | Schulte et al. | |
| 7,436,868 B2 | 10/2008 | Schulte et al. | |
| 7,443,895 B2 | 10/2008 | Schulte et al. | |
| 7,586,963 B2 | 9/2009 | Schulte et al. | |
| 7,733,932 B2 | 6/2010 | Faybishenko | |
| 7,751,458 B2 | 7/2010 | Regaard et al. | |
| 7,764,723 B2 | 7/2010 | Ovtchinnikov et al. | |
| 7,830,608 B2 | 11/2010 | Hu | |
| 7,848,372 B2 | 12/2010 | Schulte et al. | |
| 7,947,517 B2 | 5/2011 | Hisa | |
| 8,000,360 B2 | 8/2011 | Faybishenko | |
| 8,066,389 B2 | 11/2011 | Silverstein et al. | |
| 8,126,028 B2 | 2/2012 | Clifford, Jr. | |
| 8,339,598 B2 | 12/2012 | Ban et al. | |
| 8,427,749 B2 | 4/2013 | Du et al. | |
| 8,432,945 B2 | 4/2013 | Faybishenko | |
| 8,437,086 B2 | 5/2013 | Du et al. | |
| 8,488,245 B1 | 7/2013 | Chann | |
| 8,508,729 B2 | 8/2013 | Ban et al. | |
| 8,553,221 B2 | 10/2013 | Volodin et al. | |
| 8,599,485 B1 | 12/2013 | Cobb | |
| 8,654,326 B2 | 2/2014 | Volodin et al. | |
| 8,830,587 B2 | 9/2014 | Bhatia et al. | |
| 8,842,369 B2 | 9/2014 | Li | |
| 8,861,082 B2 | 10/2014 | Cobb | |
| 8,873,134 B2 | 10/2014 | Price et al. | |
| 8,891,579 B1 * | 11/2014 | Price .................. | H01S 5/02292 372/107 |
| 8,942,521 B2 | 1/2015 | Song et al. | |
| 9,005,762 B2 | 4/2015 | Liu et al. | |
| 2004/0114027 A1 | 6/2004 | Frith | |
| 2006/0165144 A1 | 7/2006 | Mikhailov et al. | |
| 2006/0280209 A1 | 12/2006 | Treusch | |
| 2007/0116071 A1 | 5/2007 | Schulte et al. | |
| 2007/0116077 A1 | 5/2007 | Farmer et al. | |
| 2007/0217467 A1 | 9/2007 | DeFranza et al. | |
| 2007/0217468 A1 | 9/2007 | DeFranza et al. | |
| 2007/0217469 A1 | 9/2007 | DeFranza et al. | |
| 2007/0217470 A1 | 9/2007 | DeFranza et al. | |
| 2007/0217471 A1 | 9/2007 | DeFranza et al. | |
| 2007/0268572 A1* | 11/2007 | Hu .................. | G02B 27/0961 359/349 |
| 2007/0268945 A1 | 11/2007 | Schulte et al. | |
| 2007/0268946 A1 | 11/2007 | Schulte et al. | |
| 2007/0268947 A1 | 11/2007 | Schulte et al. | |
| 2009/0245315 A1 | 10/2009 | Faybishenko | |
| 2009/0323752 A1 | 12/2009 | Chuyanov et al. | |
| 2010/0158060 A1 | 6/2010 | Faybishenko | |
| 2010/0226405 A1 | 9/2010 | Chuyanov et al. | |
| 2013/0148684 A1 | 6/2013 | Guo et al. | |
| 2013/0162956 A1 | 6/2013 | Okuda | |
| 2013/0194801 A1 | 8/2013 | Wolf et al. | |
| 2014/0036375 A1 | 2/2014 | Chann et at | |

FOREIGN PATENT DOCUMENTS

| | | |
|---|---|---|
| CN | 101141051 | 3/2008 |
| CN | 101144909 | 3/2008 |
| CN | 201113224 | 9/2008 |
| CN | 201515142 | 6/2010 |
| CN | 102074896 | 5/2011 |
| CN | 102437509 | 5/2012 |
| CN | 202548385 | 11/2012 |
| CN | 202720390 | 2/2013 |
| CN | 203071399 | 7/2013 |
| CN | 103368066 | 10/2013 |
| CN | 103401136 | 11/2013 |
| RU | 2010143026 | 4/2012 |
| WO | WO 2005059626 | 6/2005 |

OTHER PUBLICATIONS

International Search Report and Written Opinion for International Application No. PCT/US2015/019288, Mailed Jun. 10, 2015.

(56) References Cited

OTHER PUBLICATIONS

Notice of Allowance for corresponding U.S. Appl. No. 13/328,877, mailed Sep. 5, 2014.
Office Action for corresponding U.S. Appl. No. 13/328,877, mailed Apr. 14, 2014.

* cited by examiner

HIGH BRIGHTNESS MULTIJUNCTION DIODE STACKING

CROSS REFERENCE TO RELATED APPLICATION

This is a continuation-in-part of U.S. Non-provisional application Ser. No. 14/641,093 filed on Mar. 6, 2015, which claims the benefit of U.S. Provisional Application Ser. No. 61/949,224, filed on Mar. 6, 2014, both of which are hereby incorporated by reference in their entireties.

FIELD

The disclosure pertains to high brightness laser diodes.

BACKGROUND

Multijunction diode lasers have been demonstrated to significantly increase the output power per diode chip in a high brightness diode laser package. However, due to thermal and optical problems and constraints, these devices have typically been limited to use in quasi continuous-wave diode laser arrays for pumping solid-state lasers. With recent developments which can improve the efficiency of multijunction devices, such devices may now be used in continuous-wave operation, offering the potential for a vast array of applications. Conventional techniques for combining beams produced by multijunction diode lasers and arrays of multijunction diode lasers tend to be inefficient and improved approaches are needed.

SUMMARY

According to one aspect, an apparatus includes at least one multijunction diode laser situated to emit a plurality of beams along respective mutually parallel propagation axes, each beam having an associated mutually parallel slow axes and associated collinear fast axes, a fast axis collimator situated to receive and collimate the plurality of beams along the corresponding fast axes so as to produce corresponding fast axis collimated beams that propagate along associated non-parallel axes, and a reflector situated to receive the plurality of fast axis collimated beams and to reflect the beams so that the reflected fast axis collimated beams propagate along substantially parallel axes.

According to another aspect, a method of directing beams of a multijunction diode laser includes emitting a plurality of beams from a multijunction laser diode such that principal axes of the emitted beams are parallel, each beam associated with a slow axis that is parallel and spaced apart from slow axes associated with other emitted beams and fast axes associated with the emitted beams are collinear, collimating each of the plurality of beams along respective fast axes so that the collimated beams propagate at different angles with respect to the parallel principal axes, and reflecting the fast axis collimated beams with a reflector so that the reflected beams propagate along substantially parallel axes.

According to a further aspect, an apparatus includes at least one multijunction semiconductor laser situated on a thermally conductive mounting block, the laser including a plurality of active junctions monolithically stacked one above the other and spaced apart from each other in a semiconductor growth direction along a common injection path, each active junction including a corresponding emitting facet situated to emit a laser beam having with a fast axis and slow axis mutually orthogonal to each other and to a beam emission direction, each beam emission direction being parallel to each other beam emission direction, a fast axis collimator situated to receive and collimate the beams with respect to the fast axis of the beams and to provide the beams with a pointing difference, a slow axis collimator situated to receive and collimate the beams with respect to the slow axis of the beams, and a reflective pointing corrector situated to receive the fast axis collimated beams which have propagated at least a distance such that a substantial amount of power of the beams no longer overlaps and situated to reflect the beams such that the principal axes of the reflected beams are parallel to each other.

The foregoing and other objects, features, and advantages will become more apparent from the following detailed description, which proceeds with reference to the accompanying figures.

DETAILED DESCRIPTION

Figure 1:
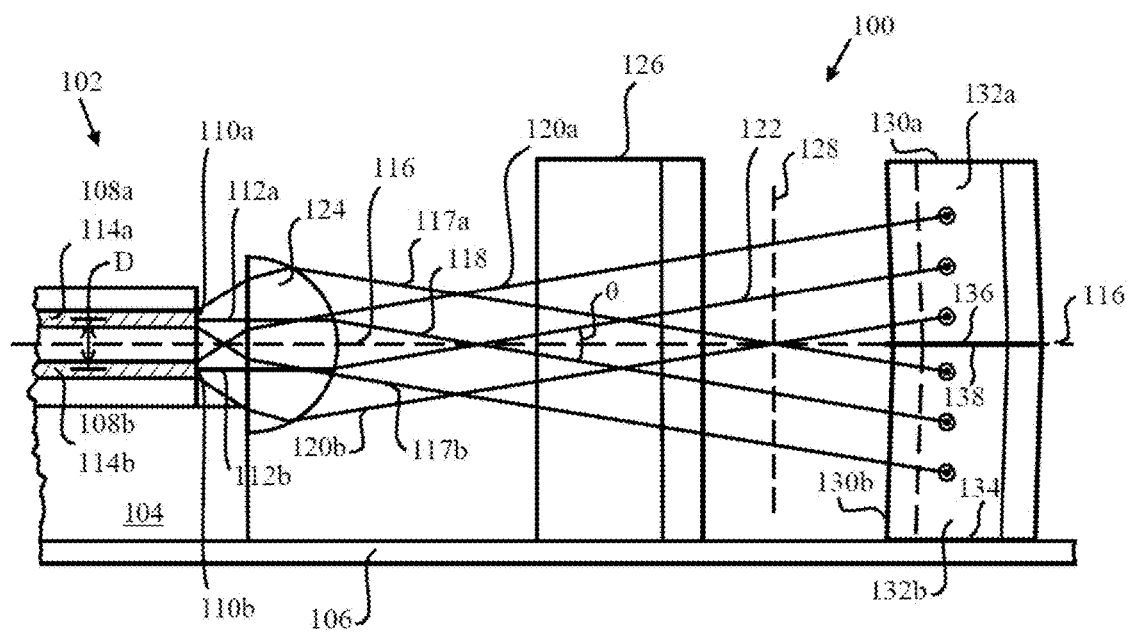
FIG. 1 is a schematic of a side view of a multijunction diode laser apparatus.

As used in this application and in the claims, the singular forms "a," "an," and "the" include the plural forms unless the context clearly dictates otherwise. Additionally, the term "includes" means "comprises." Further, the term "coupled" or does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

As used herein, optical radiation refers to electromagnetic radiation at wavelengths of between about 100 nm and 10 µm, and typically between about 500 nm and 2 µm. Examples based on available laser diode sources generally are associated with wavelengths of between about 800 nm and 1000 nm. In some examples, propagating optical radiation is referred to as one or more beams having diameters, asymmetric fast and slow axes, beam cross-sectional areas, and beam divergences that can depend on beam wavelength, beam fast and slow axes, and the optical systems used for beam shaping. For convenience, optical radiation is referred to as light in some examples, and need not be at visible wavelengths. For diode lasers and active junctions, slow axes are typically associated with the longer dimension of an emitter aperture. A longer dimension typically allows more modes and a larger spot, resulting in poorer beam parameter product and a slower divergence of emitted light. Conversely, fast axes are typically associated the shorter dimension of the emitter aperture. The shorter dimension confines light to have fewer modes and a smaller spot, resulting improved beam parameter product and a faster emission divergence.

As used herein, numerical aperture (NA) refers to a largest angle of incidence with respect to a propagation axis defined by an optical waveguide for which propagating optical radiation is substantially confined or by propagation through free space in vacuum, air, or other gases. In optical fibers, fiber cores and fiber claddings can have associated NAs, typically defined by refractive index differences between a core and cladding layer, or adjacent cladding layers, respectively. Free space optical beams as discussed above can also be referred to as having a beam NA which is associated with a beam angular radius. The term brightness is used herein to refer to optical beam power per unit area per solid angle. In some examples, optical beam power is provided with one or more laser diodes, including multi-junction laser diodes, that produce beams with solid angles proportional to beam wavelength and beam area. Selection of beam area and beam solid angle can produce pump beams that couple selected pump beam powers into one or more core or cladding layers of double, triple, or other multi-clad optical fibers.

A representative multijunction diode laser apparatus 100 as shown in FIG. 1 includes a multijunction diode laser 102 mounted on a thermally conductive base 104 which is secured to a thermally conductive housing 106. The multi-junction laser 102, shown cross-sectionally for clarity, includes two active laser junctions 108a, 108b each having associated output coupling front facets 110a, 110b from which corresponding diode laser beams 112a, 112b are emitted during laser operation. Highly reflective rear facets (not shown) are oppositely disposed from the front facets 110 so as to form corresponding resonant cavities 114a, 114h from which the beams 112 are generated. The distance between opposite facets generally defines a resonator length and can be on the order of mm. The active junctions 108 are offset from each other by a finite distance D generally centered about a central emission axis 116 so as to form a finite gap between junctions 108. The thickness of the cavities 114, i.e., in the direction of the offset D, is generally in the range of about one micron to several microns. Due to the relatively small size, the direction associated with the offset D is associated with a fast axis of the corresponding emitted beam 112. In some examples, active junctions can be gain-guided or index-guided.

In FIG. 1 the direction of the offset D is also on the order of microns and corresponds to a growth direction for the semiconductor laser 102. Different methods may be used for semiconductor growth as may be known in the art, including metal-organic chemical vapor deposition. Hence, the multiple laser junctions 108 and offsets between junctions can be formed monolithically by growing different semiconductor layers, such as with GaAs, AlGaAs, InP, and various combinations thereof, with varying degrees of doping and structural contours to achieve desired output beam wavelengths, powers, waveguiding, or other laser or apparatus parameters. Electrical current is injected into the laser 102 in the offset direction so as to power the active junctions 108 which are disposed electrically in series.

Emitted beam 112a includes portions directed along a pair of opposite marginal axes 117a, 117b and a principal axis 118 centered about a mid-plane of the resonant cavity 114a. Emitted beam 112b includes portions directed along a similar pair of opposite marginal axes 120a, 120b and a principal axis 122 centered about a mid-plane of the resonant cavity 114b. A fast axis collimation optic (FAC) 124 is disposed in the optical path of the emitted beams 112 and is situated to provide collimated outputs with respect to the fast axis of the beams, i.e., fast axis collimated beams. The effective focal length of the FAC optic 124 is typically relatively short, such as in the range of 150 to 400 μm. The offset of the beams 112 with respect to the fast axis provides the fast axis collimated beams with a pointing error θ with respect to the emission axis 116. FAC optic 124 is a plano-convex cylindrical lens as shown in FIG. 1, though it will be appreciated that bi-convex and other configurations are also suitable. Pointing error θ can be on the order of mrad depending on the effective focal length of the FAC optic 124 and offset D between emitting facets 110a, 110b. In some examples, pointing error θ is about 5 mrad.

The beams 112a, 112b have divergences that are less along a slow axis that is orthogonal to the fast axis than along the fast axis. The lesser divergences are generally associated with the larger width of the emitting facet 110 and resonant cavity 108 (i.e., a dimension into the plane of FIG. 1) which can be on the order of tens to hundreds of microns depending on the desired beam output characteristics. Because of the lesser divergences, a slow axis collimation (SAC) optic 126 is typically disposed in the optical path of the emitted beams 112 after the FAC optic 124. As shown in FIG. 1, the SAC optic 126 is a plano-convex cylindrical lens optic with an axis of curvature oriented orthogonally to the axis of curvature of the FAC optic 124, i.e., into the plane of FIG. 1. Because the SAC optic 126 collimates preferably only along the slow axis, the beams 112a, 112b typically are not redirected along the fast axis via propagation through the SAC optic 126. Similarly, the beams 112a, 112b are not redirected along the slow axes by propagation through FAC optic 124. For junctions 108 stacked one above the other with offset D in the fast axis direction, beams 112a, 112b generally do not have pointing error with respect to each other in the slow axis direction.

Collimated beams 112a, 112b propagating with respective fast axis pointing errors spatially diverge from one another along the fast axis until a plane 128 at which the beams 112a, 112b are spatially separated sufficiently that substantial portions of their respective beam powers are spatially separate. Collimated beams 112 typically have a substantially Gaussian beam profile along the fast axis resulting in a non-zero beam power that diminishes exponentially after a selected convention for beam width. In typical examples, beam widths and corresponding spatial separation for Gaussian beams are defined as a radial distance from a center position where beam intensity diminishes to $1/e^2$ of peak intensity, which corresponds to about 86% of the total beam power being within the selected radius. In other examples, the beam width is defined by a further reduction in intensity, such as $1/e^3$ corresponding to about 95% total beam power being within a selected radius that is about 22% larger than the $1/e^2$ radius, or $1/e^4$ corresponding to about 98% total beam power being within a selected radius that is about 42% larger than the $1/e^2$ radius. Less than about 0.05% total beam power lies outside a selected radius that is twice the $1/e^2$ radius for an ideal Gaussian beam.

Reflectors 130a, 130b are disposed along the propagation path of the beams 112 adjacent to plane 128, i.e., after the beams become spatially separated sufficiently along the beam fast axes such that the beams no longer substantially overlap. The reflectors 130a, 130b are situated with respective specular front surfaces 132a, 132b arranged at about 45° with respect to the incident transverse plane of the beams 112 in order to reflect the beams at about 90°, i.e., out of the plane of FIG. 1. Adjacent reflectors 130a, 130b are adjusted to slightly different angles to compensate the pointing error θ of the incident collimated beams 112a, 112b so that the collimated, reflected beams 112 or principal axes 118, 122 are parallel to each other and to the parallel slow axes of the beams 112a, 112b emitted from the front facets 110a, 110b. The reflected parallel beams can have some tolerance error associated with the degree to which the beams are parallel, however such tolerance is less than the divergence associated with the incident beams. For example, a 7 mrad divergence angle can be corrected to be within about ±2 mrad after reflection.

For example, a bottom surface 134 of lower reflector 130b can be secured with a UV curable epoxy to the housing 106, and aligned by rotating and tilting the reflector 130b prior to cure so that collimated beam 112a is reflected perpendicularly and substantially parallel to the emitter facet 110a or otherwise directed to a desired location on a focusing objective or coupling fiber (not shown). The bottom surface 136 of upper reflector 130a can then be secured with UV curable epoxy to a top surface 138 of lower reflector 130b and aligned by rotating and tilting the reflector 130a so that collimated beam 112b is reflected perpendicularly and parallel or substantially parallel to the reflected principal axis 118 of beam 112a.

The alignment of the reflector surfaces 132 for pointing correction of the beams 112 provides a small angular difference between the reflector surfaces 132. Collimated, reflected, and pointing-corrected beams 112 are then received by a focusing objective for subsequent coupling into an optical fiber. Thus, the multiple beams 112 from the monolithic set of multiple emitters 110 are reflected in a closely packed, etendue efficient manner using fewer optics per emitter than single junction emitter examples. In additional examples, the reflectors 130 are secured or formed together with a predetermined angular difference for correction of the pointing error θ. An assembly or singular reflector can then be aligned and secured to the housing 106 without the additional step of mounting an additional reflector, such as the reflector 130a to the reflector 130b, during package assembly.

Figure 2:
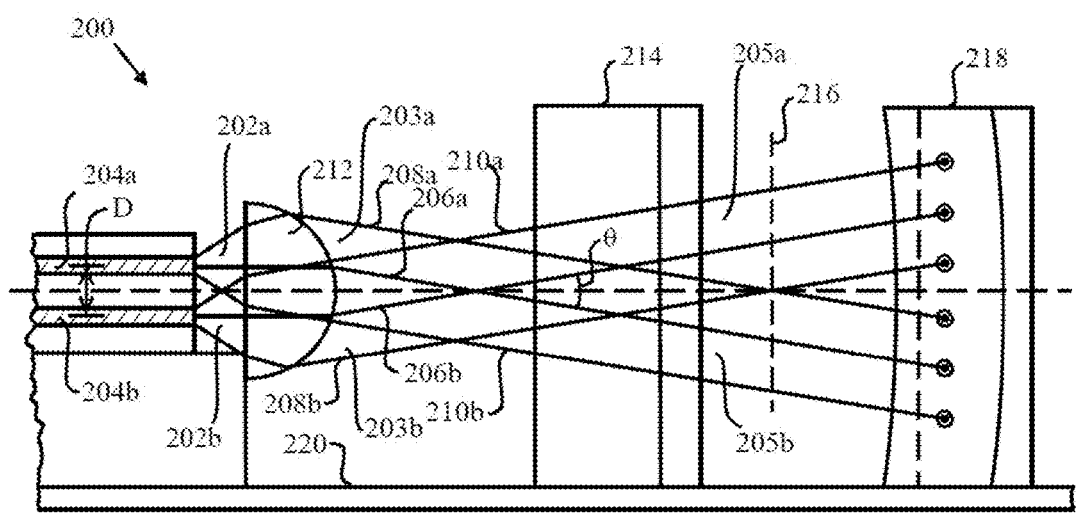
FIG. 2 is a schematic of a side view of another multijunction diode laser apparatus.

FIG. 2 shows a multijunction diode laser apparatus 200 emitting a pair of beams 202a, 202b from a monolithically formed pair of active junctions 204a, 204b. The emitted beams propagate along respective parallel principal axes 206a, 206b and respective marginal axis pairs 208a, 210a and 208b, 210b. Upon emission, the beams 202a, 202b diverge rapidly along a fast axis and are received by a short focal length cylindrical FAC lens 212 which collimates the emitted beams 202a, 202b with respect to a beam fast axis so that corresponding collimated beams 203a, 203b have a pointing difference θ in the fast axis. A cylindrical SAC lens 214 receives the fast axis collimated beams 203a, 203b and collimates the beams along their slow axes to produce fully collimated beams 205a, 205b.

After propagating a selected distance from emitting facets of the active junctions 204a, 204b, to a plane 216, the fully collimated beams 205a, 205b diverge sufficiently with respect to each other so as to be separated. At or after such distance, a cylindrical mirror reflector 218 is disposed so as to reflect the fully collimated beams 205a, 205b at about 90° such that the principal axes 206a, 206b are, as reflected, parallel and parallel to the slow axes of the emitting facets of the active junctions 204a, 204b. The reflected beams are depicted as coming out of the plane of FIG. 2 with enclosed circles at a specular surface of the cylindrical reflector 218. The marginal axes 208, 210 can receive a small amount of focusing effect by reflection by the cylindrical reflector 218. The cylindrical reflector 218 can be positioned to align the reflected beams and secured to a housing surface 220 in the aligned position with a securing material, such as UV-cured epoxy.

Figure 3:
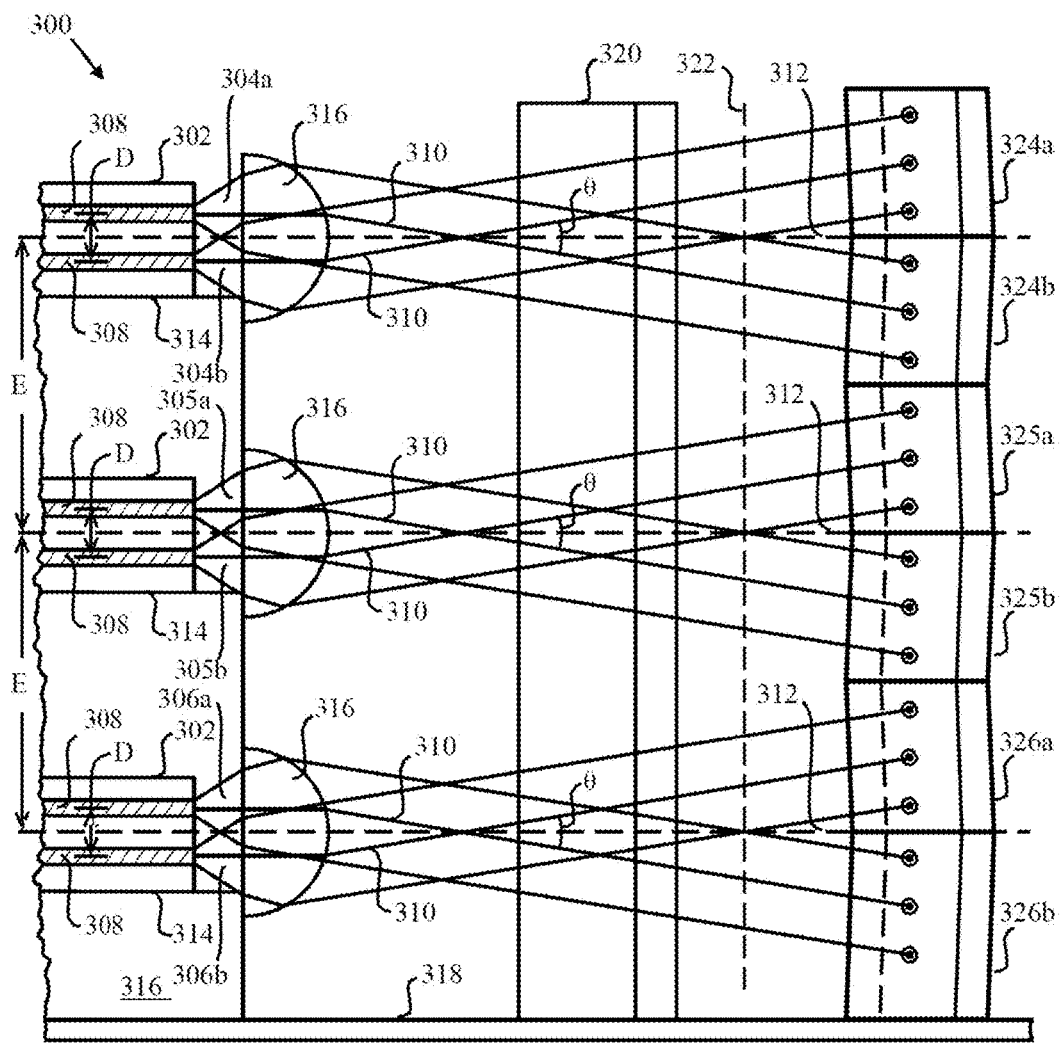
FIG. 3 is a schematic of a side view of another multiple multijunction diode laser apparatus.

In FIG. 3 a multiple multjunction diode laser apparatus 300 includes three multijunction diode lasers 302 each emitting a corresponding pair of beams 304a, 304b, 305a, 305b, 306a, 306b from associated active junctions 308 such that the beams have principal propagation axes 310 parallel to and spaced apart from each other. Each beam principal axis 310 of a pair of beams is offset by a distance D in a semiconductor growth direction generally associated with a growth spacing between corresponding active junctions 308 of the multijunction diode laser which generate the beams. The growth offset D provides a predetermined gap between the emitting facets of the corresponding active junctions of the multijunction diode laser 302. The gap between junctions 308 can be on the order of microns, including less than about 1 μm to 10 μm in some examples.

Each pair of principal axes 310 associated with a multijunction diode laser 302, centered about a central multijunction diode laser axis 312, is spaced apart by a distance E from each pair of principal axes 310 of an adjacent multijunction diode laser 302. The distance E is generally larger than offset distance D between active junctions of a particular diode laser 302. Each multijunction diode laser 302 is mounted to a mounting block surface 314 of a thermally conductive mounting block 316 mounted to a thermally conductive housing 318, with each adjacent mounting block surface 314 being successively higher into the plane of FIG. 3 so as to provide the offset distance E. Each mounting block surface 314 can be provided by a separate mounting block or can be joined together or formed into the same mounting block, as may be convenient. The distance E between adjacent mounting block surfaces can be on the order of 100s of μm. In one example, the distance E is about 450 μm.

Beams 304, 305, 306 diverge rapidly in a fast axis upon emission from corresponding active junctions 308. Each beam pair is received by a corresponding fast axis collimator 316 which collimates the fast axes of each beam of the pair and provides a pointing difference θ between the principal propagation axes 310 of the beams of the pair. Three slow axis collimators 320 are attached to the housing 318 (and spaced apart into the plane of FIG. 3 so that only one is visible) with each situated to receive a corresponding pair of fast axis collimated beams 304, 305, 306. As shown, each slow axis collimator is the same height as each other slow axis collimator. As with other optical components herein, it will be appreciated that heights, focal lengths, and other parameters may be varied to correspond with different package, diode, optical, or other requirements.

At a predetermined distance for each pair of beams, generally denoted with line 322, the power of each beam of the pair will no longer substantially overlap the other beam of the pair. At this position for further along spatially in the direction of propagation, each pair of beams 304, 305, 306 is received by a pair of reflective components 324a, 324b, 325a, 325b, 326a, 326b situated to reflect the incident beams at about a 90° angle such that the principal axes 310 of the reflected beams are about parallel with the longer width dimension associated with the emitting facets of the active junctions 308, i.e., out of the plane of FIG. 3. The principal axes 310 of the reflected beam are also parallel to each other, indicated generally by an encircled point, and therefore no longer include the pointing error θ associated with the offset between active junctions 308 of a particular multijunction diode laser 302.

Figure 4A:
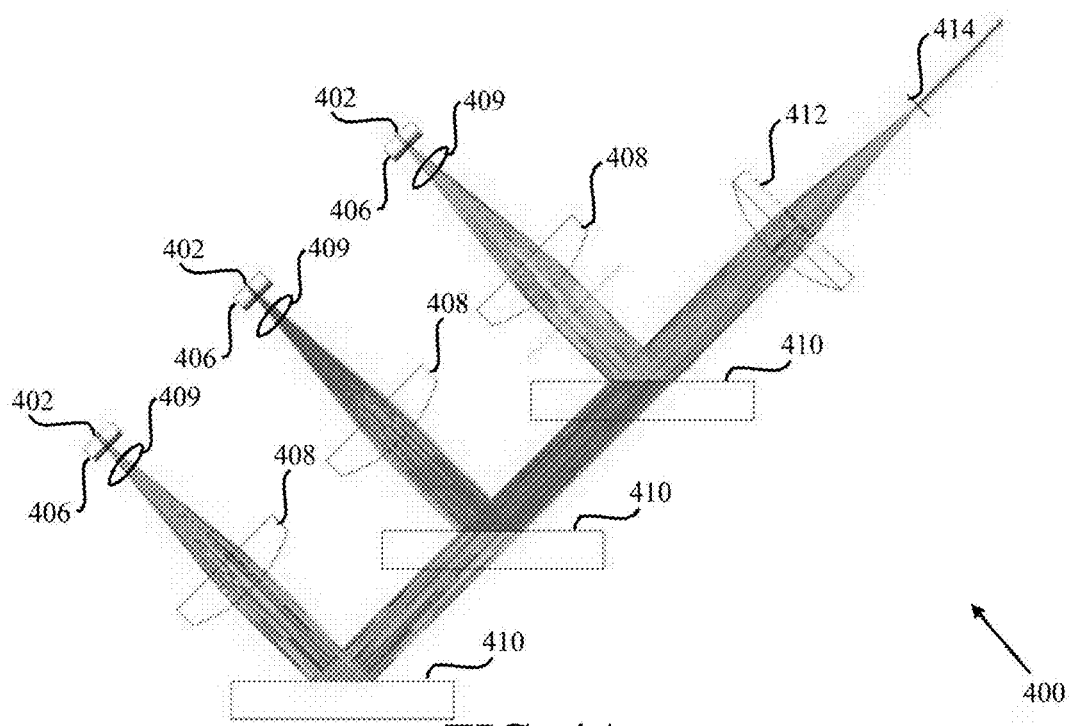
FIG. 4A is a schematic of a top view of a ray trace for a multijunction diode laser apparatus.
Figure 4B:
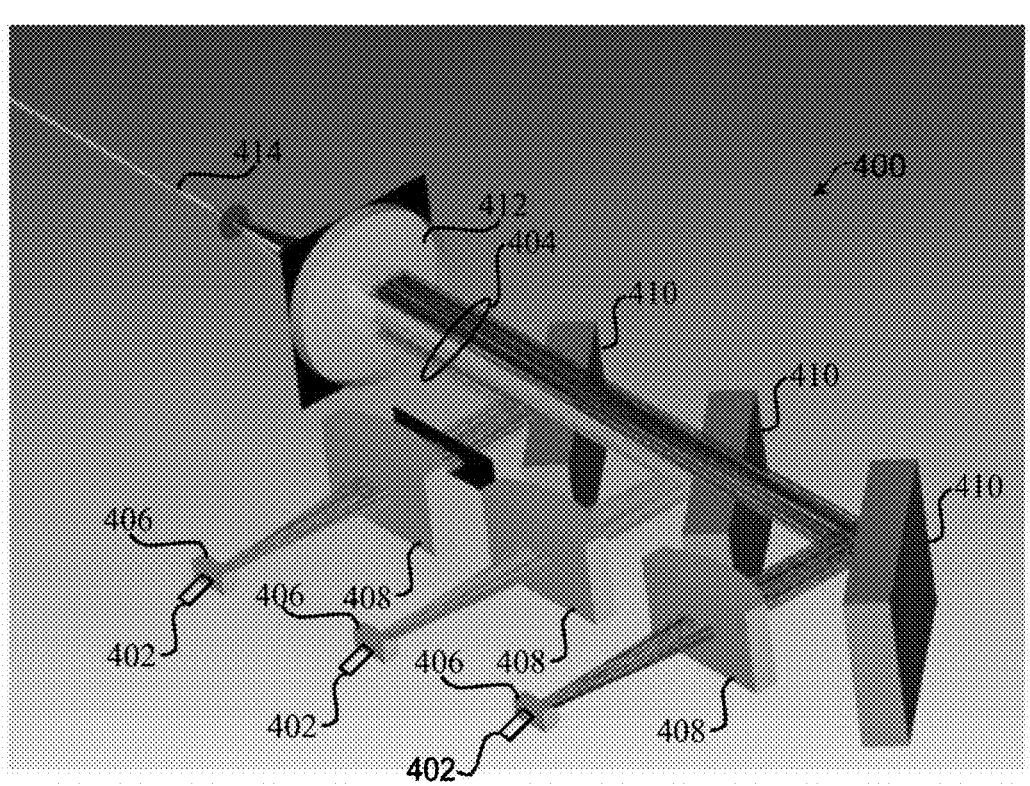
FIG. 4B is a perspective view of the multijunction diode laser apparatus of FIG. 4A.

FIGS. 4A and 4B are a top view and perspective view respectively of an optical ray-trace of a multijunction diode laser apparatus 400 that includes three multijunction diode lasers 402 which are spaced apart from each other vertically and horizontally such that the pairs of diode laser beams 404 associated with each diode laser 402 are emitted in approximately the same plane. Each pair of beams 404 is collimated in the fast axis with fast axis collimators 406 and collimated in the slow axis with slow axis collimators 408. An offset is provided in a growth direction (coming out of the plane of FIG. 4A) of the multijunction diode laser 402 such that each beam 402 of a pair of beams associated with a diode laser 404 has a pointing difference with respect to the other beam in the pair in the fast axes of the beams after propagating through the fast axis collimator 406.

Turning reflectors 410 are each situated to receive a corresponding pair of collimated beams 404 after the collimated beams 404 have diverged sufficiently with respect to each other in the fast axis such that a substantial amount of beam power no longer overlaps. Each turning reflector 410 reflects the corresponding pair of collimated beams 404 perpendicularly or close to perpendicularly into approximately the same plane as the corresponding active regions of the diode laser 402 which emitted the beams and eliminates the pointing difference in the pair of beams 404. In some examples turning mirrors 410 can be compound reflectors which include a planar surface to correspond to each incident beam of the pair of beams 404. In other examples turning mirrors 410 can be mirrors with a large radius of curvature to provide the pointing correction, which is typically less than about 1°. A focusing objective 412 is situated to receive the pointing-corrected beams 404 and to focus the beams into an optical fiber 414.

Figure 8:
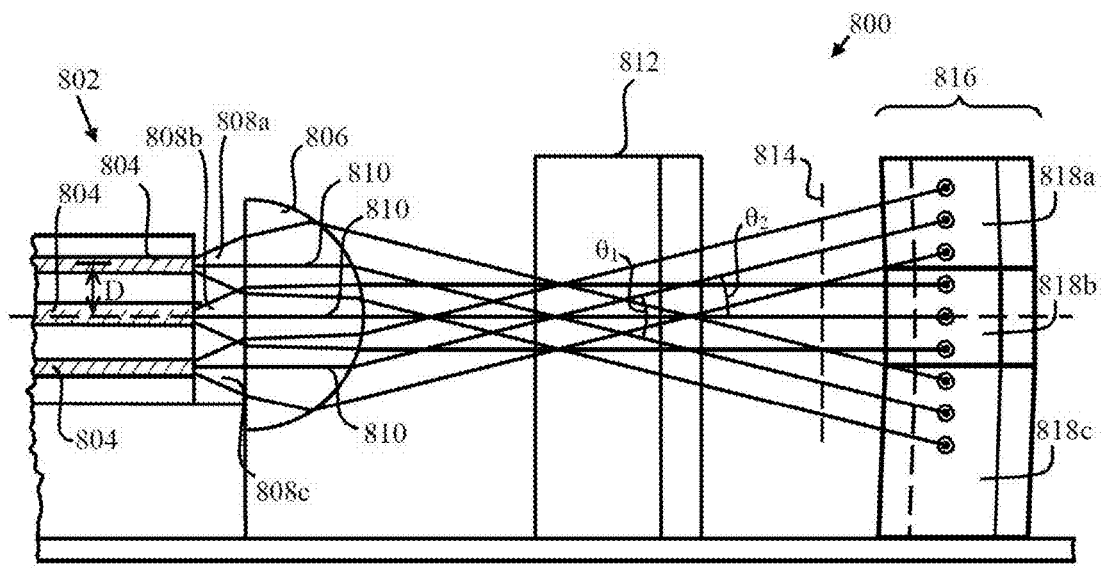
FIG. 8 is a schematic of a side view of another multijunction diode laser apparatus.

A multijunction diode laser apparatus 800 is disclosed in FIG. 8 which includes a multijunction diode laser 802 having three active junctions 804. The three junctions 804 are spaced apart from each other by an offset pitch D which is on the order of a few to several microns. A fast axis collimator 806 is situated adjacent to the emitting facets of the multijunction diode laser 802 and receives the quickly diverging diode laser beams 808a, 808b, 808c emitted from the active junctions 804. Due to the offset and multiple offsets between active junctions, beams 808 coupled into FAC 806 emerge with pointing differences, such as θ1 and θ2, between different principal axes 810 of beams 808. A slow axis collimator 812 is disposed in the propagation path of the beams 808 in order to collimate the respective slow axes of the beams 808. At a predetermined distance 814, the fast axis collimated beams 808 propagate such that for each beam 808 a substantial amount beam power associated with a selected beam width no longer overlaps other beams 808. At or after such distance, a reflector 816 is positioned to reflect the incident and spatially separated beams such that the reflected beams 808 have their respective principal axes parallel to each other. As shown in FIG. 8, the reflector 816 includes three planar reflective components 818a, 818b, 818c, each aligned slightly different than the other in order to provide the reflected beams parallel to each other.

Figure 5A:
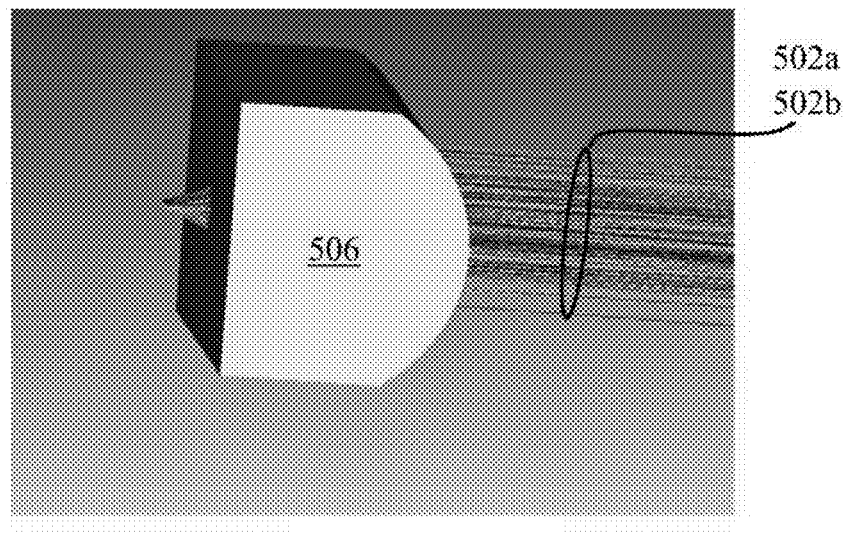
FIG. 5A is a perspective view of a ray trace for a multijunction diode laser optically coupled to a fast axis collimation optic.
Figure 5B:
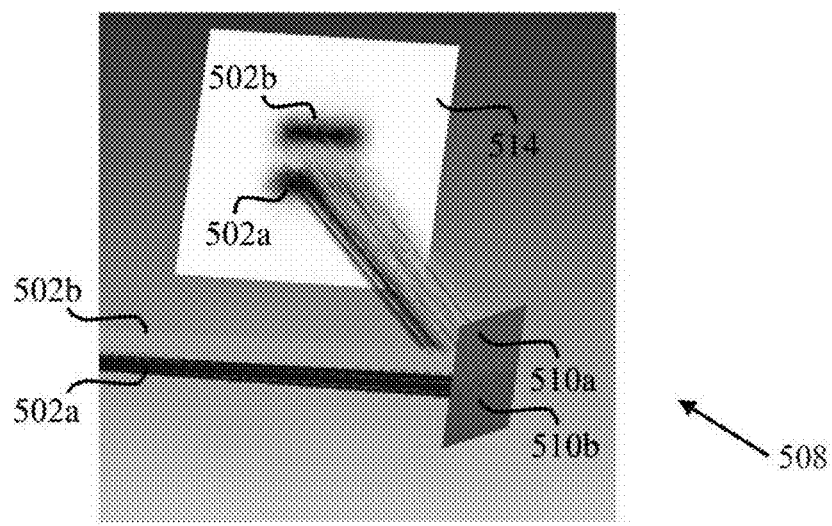
FIG. 5B is a perspective view of a ray trace for a divergent pair of multijunction diode laser beams.
Figure 5C:
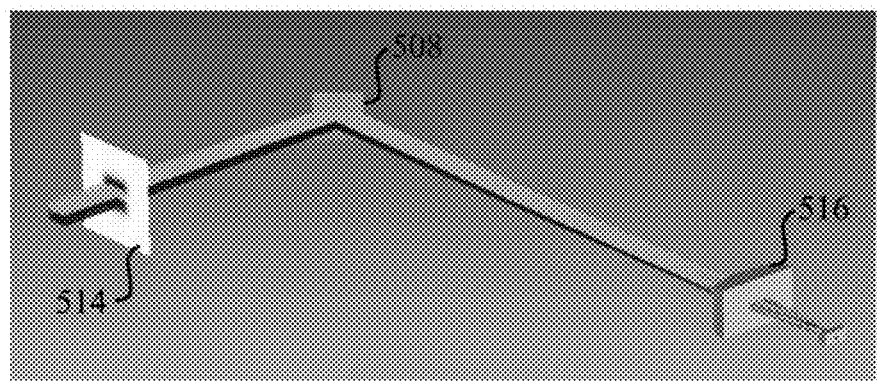
FIG. 5C is a perspective view of a ray trace for the multijunction diode laser and corresponding componentry of FIGS. 5A and 5B.
Figure 6:
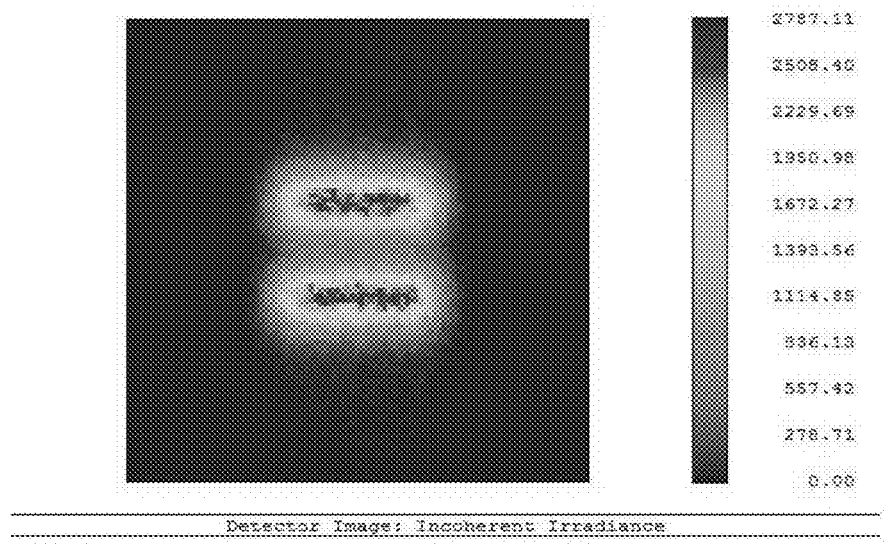
FIG. 6 is an optical intensity profile map for a pair of multijunction diode laser beams.

FIGS. 5A-5C are a ray traces of a multijunction diode laser 500 emitting a pair of beams 502a, 502b which substantially overlap shortly after emission. The emitted beams 502 are rapidly divergent in the fast axis and are received by a plano-convex cylindrical fast axis collimator 506 with a short effective focal length which collimates the beams 502. However, since the beams 502 are emitted from facets of the multijunction diode laser 504 which are offset in the direction of the fast axis, a pointing difference is present in the collimated beams 502 along the fast axis, causing the beams to eventually cross a middle axis between the beams at a predetermined position downstream from the fast axis collimator 506. A turning mirror 508 having lower emitted beam and upper emitted beam planar components 510a, 510b is situated to receive the separated beams and to reflect the beams 502 such that the pointing different between the beams is substantially removed. In some examples, a cylindrical mirror is used as turning mirror 508 in place of a plurality of stacked planar components 510. A single cylindrical mirror can have the added benefit of correcting the principal axes of more than two emitters of a multijunction diode laser. A beam intensity cross-section 514 illustrates the transverse intensity profiles of the beams 502 and the proximity of the reflected parallel beams 502a, 502b. A slow axis collimator 516 is also positioned in the path of the beams 502 in order to collimate the slow axes of the beams. FIG. 6 shows an intensity profile cross-section for a pair of beams emitted from a multijunction diode laser and having propagated about 13 cm from the emitting facets of the laser.

In one example, a diode laser package includes three multijunction diode lasers emitting six beams which are collimated, pointing-corrected, and optically coupled into a 0.135 NA fiber having a 105 μm core diameter. In another example, a diode laser package includes three multijunction diode lasers emitting nine beams (i.e., three emitters per multijunction diode laser) which are collimated, pointing-corrected, and optically coupled into a 0.15 NA fiber having a 105 μm core diameter. In additional examples, polarization multiplexing components are used to double the brightness of the diode laser package. In some examples, a finite distance or offset in the fast axis between emitters of a multijunction diode laser can range from 1 μm or less than 1 μm up to about 10 μm and a FAC lens with a short effective focal length, such as between about 150 μm and 400 μm) can be coupled to the emitted beams allowing the propagating optical beams to become spatially separated in the fast axis.

In another example, a multijunction diode laser includes a pair of active junctions offset from each other with a 2 μm pitch center to center in the fast axis and the emitting facet of each active junction includes a 2 μm×75 μm emitting aperture for emitting respective diode laser beams. The beams are collimated to a beam diameter of about 300 μm using a FAC lens with 320 μm effective focal length and a SAC lenswith 12 mm effective focal length. Due to propagation through the FAC lens, the propagating beams have a small pointing difference of about 5 mrad. The beams propagate about 25 mm before becoming spatially separated in the fast axis. In another example, two 2 μm aperture emitting facets are spaced apart from each other by 3.6 μm center to center. The beams are collimated with a FAC with an effective focal length of 320 μm, resulting in a pointing difference between emitters of about 0.161° approximately 3 cm from the emitter facets. The separation between the emitters and the focal length of the FAC can both be used to tailor the desired location for positioning one or more turning mirrors situated to reflect the collimated beams and to correct the pointing difference. The SAC is generally positioned before the turning mirror though it can be positioned after in some examples.

Figure 7:
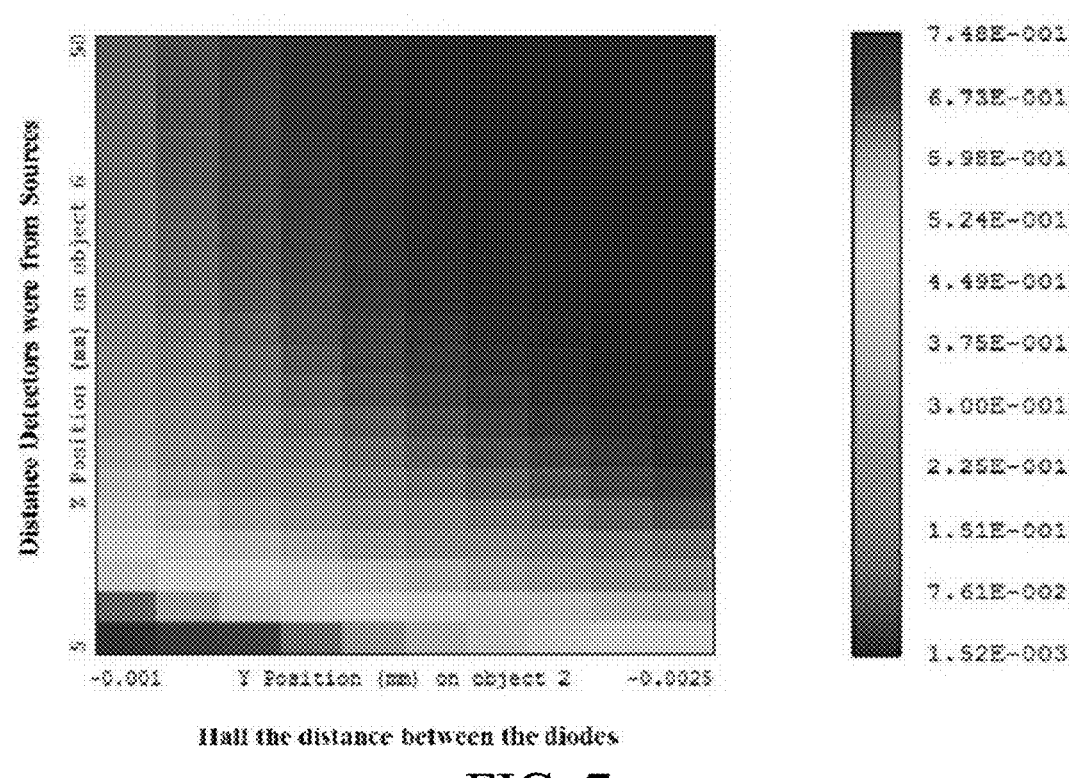
FIG. 7 is a two-dimensional plot of emitter offset and separation distance for multijunction diode lasers.

FIG. 7 is an example of a two-dimensional analysis of a relationship between active junction offset and beam propagation distance where substantial power separation occurs. As can be seen from the chart, turning mirrors can be disposed at different positions to balance brightness, packaging, and other considerations for coupling the beams into an optical fiber, and out of the package housing.

In various examples herein, the output power per diode laser is substantially increased over conventional single-emitter diode lasers since the output power scales with the number of active junctions stacked in the diode laser. Embodiment examples can have increased power while using fewer optics typically associated with such increases. For example, the increased output power can be coupled into an optical fiber using a single FAC and SAC for each multijunction diode instead of with additional FACs and SACs. The increased output power can be provided using a housing similar to a single-emitter configuration effectively resulting in a reduced diode laser package volumetric footprint approximately scaling with the number of active junctions stacked in the multijunction diode lasers.

Narrow Emitter Pitch and Overlapped Beams

Figure 9:
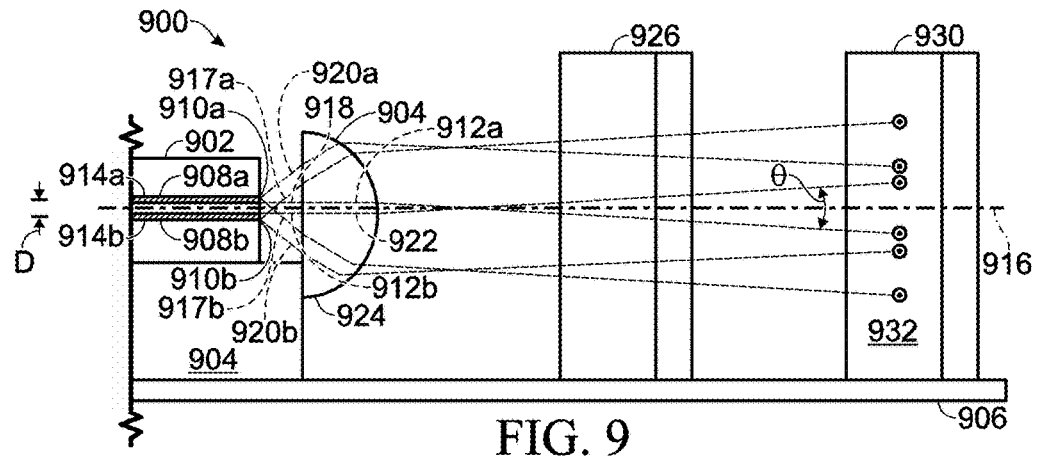
FIG. 9 is a schematic of a side view of a collimating portion of yet another, fourth multijunction diode laser apparatus according to the present invention.

Turning to FIG. 9, a fourth multijunction diode laser apparatus 900 includes a multijunction diode laser 902 mounted on a thermally conductive base 904 which is secured to a thermally conductive housing 906. The multijunction laser 902, shown cross-sectionally, includes two active laser junctions 908a, 908b, each having associated output coupling facets 910a, 910b from which corresponding diode laser beams 912a, 912b are emitted during laser operation. Highly reflective rear facets (not shown) are oppositely disposed from the facets 910 so as to form corresponding resonant cavities 914a, 914b from which beams 912 are generated. The distance between opposite facets generally defines the resonator and can be on the order of mm. The active junctions 908 are offset from each other by a distance D generally centered about a central emission axis 916 so as to form a gap between junctions 908. The thickness of the cavities 914, i.e., in the direction of the offset D, is generally in the range of about one micron to several microns. Due to the relatively small size, the direction associated with the offset D is associated with a fast axis of the corresponding emitted beams 912a and 912b. In some examples, active junctions can be gain-guided or index-guided.

In FIG. 9, the offset D is also on the order of microns and corresponds to a growth direction for the semiconductor laser 902. Different methods may be used for semiconductor growth as may be known in the art, including metal-organic chemical vapor deposition. Hence, the multiple laser junctions 908 and offsets between junctions can be formed monolithically by growing different semiconductor layers, such as with GaAs, AlGaAs, InP, and various combinations thereof, with varying degrees of doping and structural contours to achieve desired output beam wavelengths, powers, waveguiding, or other laser or apparatus parameters. Electrical current is injected into the laser 902 in the offset direction so as to power the active junctions 908 which are disposed electrically in series.

In the foregoing respects, the fourth multijunction diode laser apparatus 902 is similar to multijunction diode laser apparatuses 202 and 302. However, diode laser 902 differs in that the center-to-center spacing D between junctions 908a, 908b is significantly less relative to the emitting area of the output coupling facets 910 so that, when the respective beams are collimated in the fast axis they are substantially overlapped. For example, whereas the cavity thicknesses of diode laser apparatuses 202 and 302 may be about 2.0 µm and the center-to-center spacing may be about 3.6 µm, the cavity thicknesses of diode laser apparatus 902 in the fast axis may be about 1.5 µm and the center-to-center spacing D in the fast axis may be about 3 µm. The resulting divergence of the respective laser beams and closer spacing causes the collimated beams to substantially overlap in the fast axis. For purpose of the narrow emitter pitch and overlapped beams embodiments herein, two Gaussian beams are substantially overlapped when their $1/e^2$ beam widths overlap at least 80%, preferably at least 90%, and more preferably at least 95%.

Emitted beam 912a includes portions directed along a pair of opposite marginal axes 917a, 917b and a principal axis 918 centered about a mid-plane of the resonant cavity 914a. Emitted beam 912b includes portions directed along a similar pair of opposite marginal axes 920a, 920b and a principal axis 922 centered about a mid-plane of the resonant cavity 914b. A fast axis collimation optic (FAC) 924 is disposed in the optical path of the emitted beams 912 and is situated to provide collimated outputs with respect to the fast axis of the beams, i.e., fast axis collimated beams. The effective focal length of the FAC optic 924 is typically relatively short, such as in the range of 150 to 400 µm.

In contrast to the multijunction diode laser apparatus 100 shown in FIG. 1, in the multijunction diode laser apparatus 900 the shorter offset of the beams 912 with respect to the fast axis provides the fast axis collimated beams with less pointing difference θ with respect to the emission axis 916. In addition, the thinner cavities 914 produce greater fast-axis divergence so that the collimated beams substantially overlap for a relatively large distance, thereby eliminating the need to correct the beam paths for pointing difference, as will be explained further hereafter.

Ideally, the two junctions 908 are placed as close together as possible to optimize brightness preservation in the fast axis. As the facets are reimaged to the aperture of an optical fiber, making the spacing between junctions 908 as small as possible enables the size of the fiber can be minimized. In addition, if the spacing between the junctions is sufficiently reduced the optical modes in each emitter may be made to couple, even coherently. However, by minimizing the spacing between the junctions the evanescent tails of the fast axis optical modes can interact with the highly doped tunnel junction. Thence, the tunnel junction should preferably be placed at the null of the coupled modes to reduce optical loss due to free carrier absorption.

FAC optic 924 is a plano-convex cylindrical lens as shown in FIG. 9, though it will be appreciated that bi-convex and other configurations are also suitable. A pointing difference θ can be on the order of a few mrad depending on the effective focal length of the FAC optic 924 and offset D between emitting facets 910a, 910b. By way of example, for a multijunction diode laser with about 3 µm pitch and about 1.5 µm emitting areas collimated to beam diameter of about 300 µm, the pointing difference may be as little as 5 mrad. Such beams would have to propagate about 30 mm to be substantially separated. For purposes herein, a pointing difference that is approximately 5 mrad or less is defined as being "minimal."

The beams 912a, 912b have divergences that are less along a slow axis that is orthogonal to the fast axis than along the fast axis. The lesser divergences are generally associated with the larger width of the emitting facets 910 and resonant cavities 908 (i.e., a dimension into the plane of FIG. 9) which can be on the order of tens to hundreds of microns depending on the desired beam output characteristics. Because of the lesser divergences, a slow axis collimation (SAC) optic 926 is typically disposed in the optical path of the emitted beams 912 after the FAC optic 924. As shown in FIG. 9, the SAC optic 926 is a plano-convex cylindrical lens optic with an axis of curvature oriented orthogonally to the axis of curvature of the FAC optic 924, i.e., into the plane of FIG. 9. Because the SAC optic 926 collimates preferably only along the slow axis, the beams 912a, 912b typically are not redirected along the fast axis via propagation through the SAC optic 926. Similarly, the beams 912a, 912b are not redirected along the slow axes by propagation through FAC optic 924. For junctions 908 stacked one above the other with offset D in the fast axis direction, beams 912a, 912b generally do not have pointing difference with respect to each other in the slow axis direction.

Reflector 930, having a specular front surface 932, is disposed along the propagation path of the beams 912 and is arranged at about 45° with respect to the incident transverse plane of the beams 912 in order to reflect the beams at about 90°, i.e., out of the plane of FIG. 1. Unlike the reflectors 130 associated with multijunction diode laser apparatus 100, there is no need for a pair of reflectors adjusted to slightly different angles to compensate the pointing difference θ of the incident collimated beams 912, because the difference is sufficiently small relative to the beam widths that both beams can be imaged into the aperture of a fiber laser, as will be discussed in more detail below.

Figure 10:
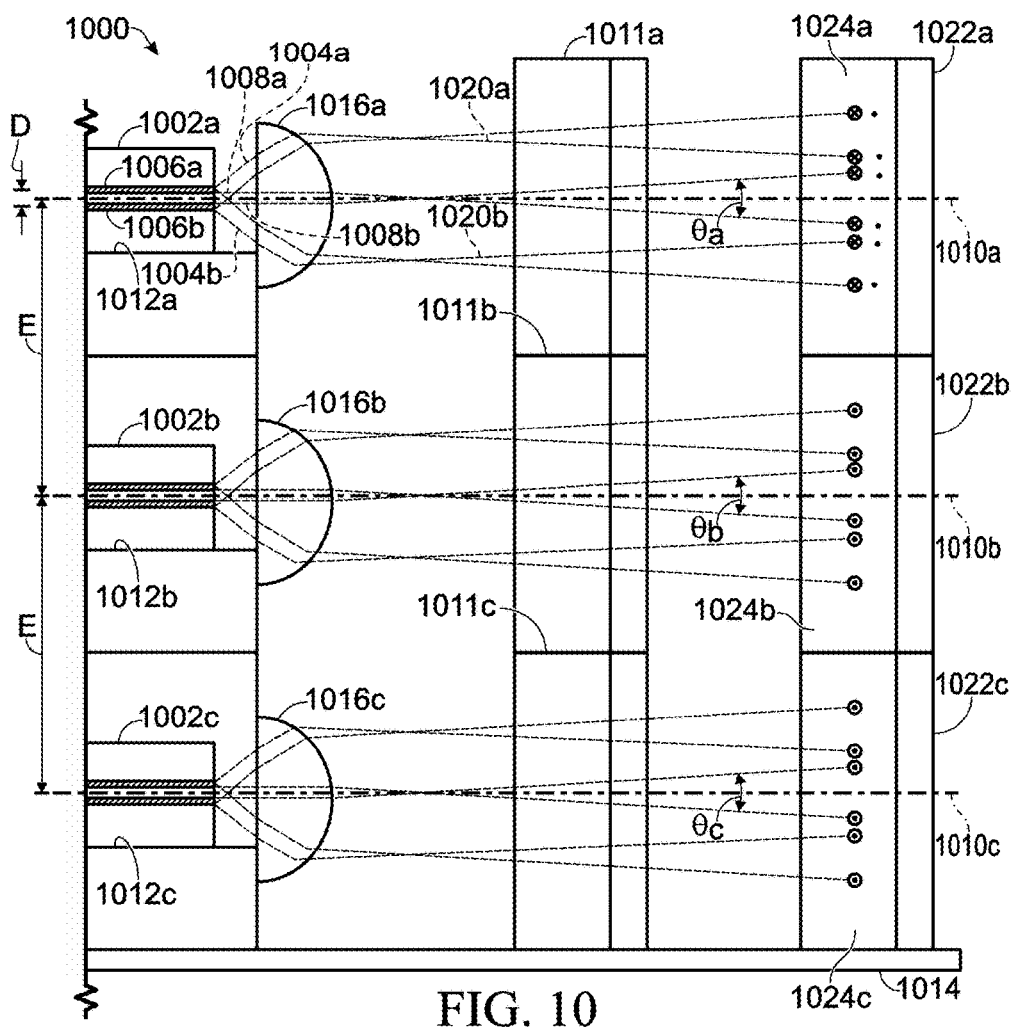
FIG. 10 is a schematic of a side view of the collimating portions of another multiple multijunction diode laser apparatus according to the present invention, employing three multijunction diode laser apparatuses of the type shown in FIG. 9.

In FIG. 10 a multiple multjunction diode laser apparatus 1000 includes three multijunction diode lasers 1002a, 1002b, 1002c each emitting a corresponding pair of beams 1004a, 1004b from associated active junctions 1006a, 1006b such that the beams have principal propagation axes 1008a, 1008b parallel to and spaced apart from each other. Each beam principal propagation axis 1008 of a pair of beams is offset by a distance D in a semiconductor growth direction generally associated with a growth spacing between corresponding active junctions 1006a, 1006b of the multijunction diode lasers which generate the beams. The offset D provides a predetermined gap between the emitting facets of the corresponding active junctions of the multijunction diode laser 1002. The gap between junctions D can, for example, be on the order of microns, including less than about 1 µm to 10 µm.

Each pair of principal axes 1008 associated with a multijunction diode laser 1002, centered about a central multijunction diode laser axis 1010, is spaced apart by a distance E from each pair of principal axes 1008 of an adjacent multijunction diode laser 1002. The distance E is generally larger than the offset distance D between active junctions of a particular diode laser 1002. Each multijunction diode laser 1002 is mounted to a mounting block surface 1012 of a thermally conductive housing 1014, with each adjacent mounting block surface 1012 being successively higher in the plane of FIG. 10 so as to provide the offset distance E. Each mounting block surface 1012 can be provided by a separate mounting block or can be joined together or formed into the same mounting block, as may be convenient. The distance E between adjacent mounting block surfaces can be on the order of 100s of µm.

Each beam pair 1008 is received by a corresponding fast axis collimator 1016 which collimates the fast axes of each beam of the pair and provides a pointing difference θ between the principal propagation axes 1010 of the beams of the pair. Three slow axis collimators 1018 are attached to the housing 1014 with each situated to receive a corresponding pair of fast axis collimated beams 1020a, 1020b. As shown, each slow axis collimator is the same height as each other slow axis collimator. As with other optical components herein, it will be appreciated that heights, focal lengths, and other parameters may be varied to correspond with different package, diode, optical, or other requirements.

For each multiple multjunction diode laser apparatus 1002 there is a corresponding turning reflector 1022, having a specular front surface 1024, disposed along the propagation path of the beams 1020 and arranged at about 45° with respect to the incident transverse plane of the beams 1020 in order to reflect the beams at about 90°, i.e., out of the plane of FIG. 1. Unlike the reflectors 130 associated with multijunction diode laser apparatus 100, there is no need for a pair of reflectors adjusted to slightly different angles to compensate the pointing difference θ of the incident collimated beams 1020, because the difference is sufficiently small relative to the beam widths that both beams of each diode laser 1002 can be imaged into the aperture of a fiber laser, as will be discussed in more detail below.

Figure 11:
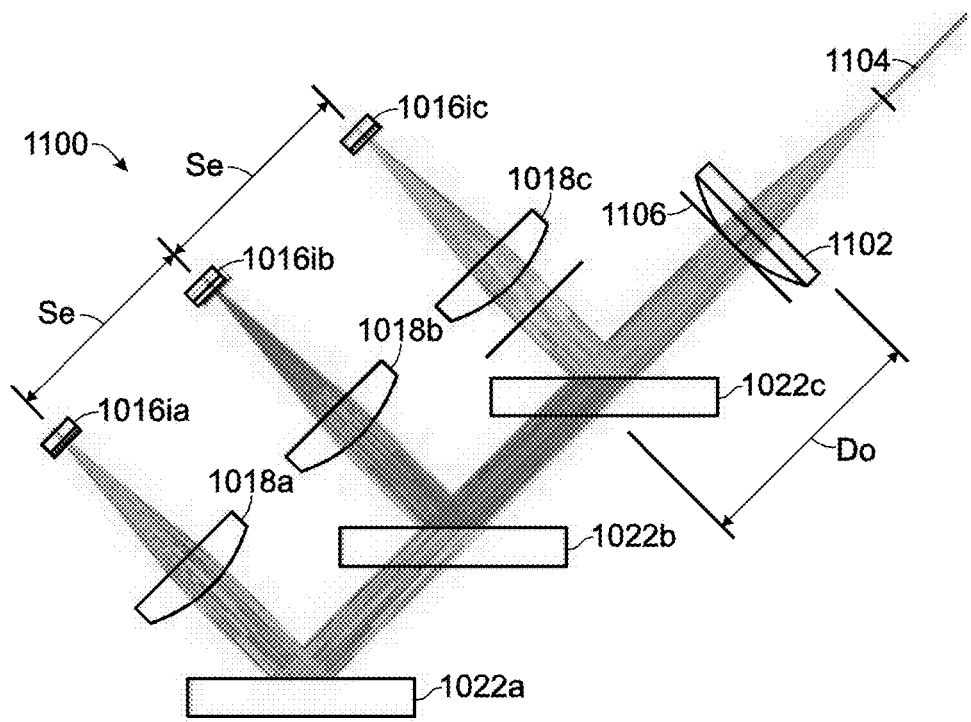
FIG. 11 is a schematic of a top view of a ray trace for the multiple multijunction diode laser apparatus of FIG. 10.
Figure 12:
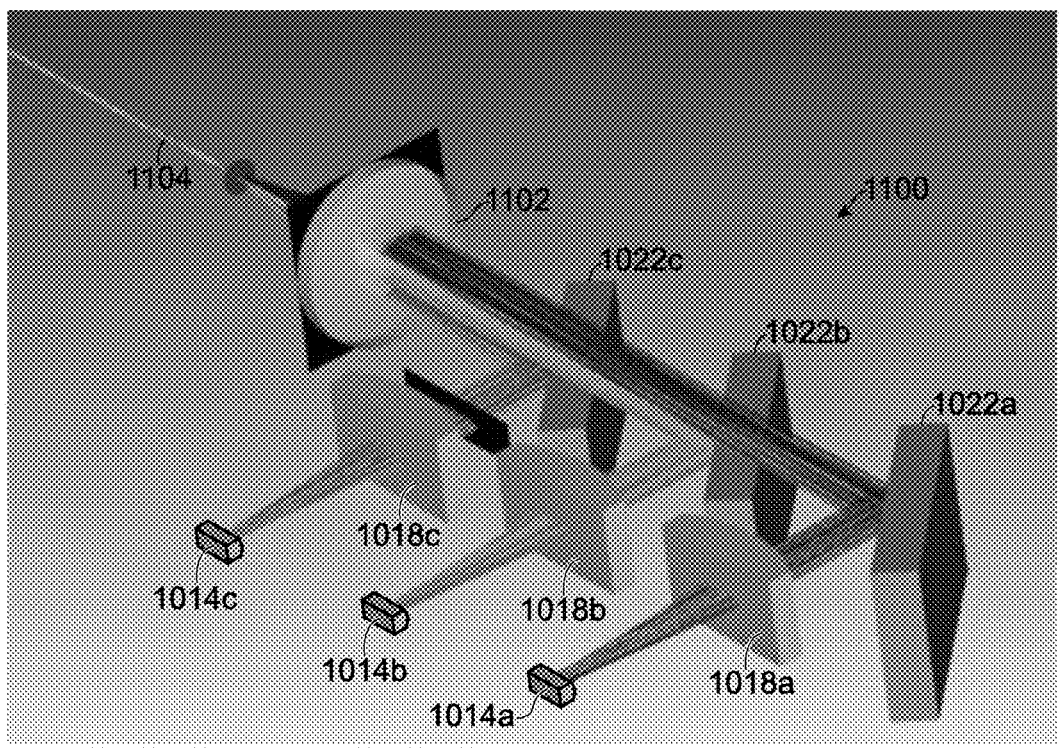
FIG. 12 is a perspective view of the multiple multijunction diode laser apparatus of FIG. 10.

FIGS. 11 and 12 are a top view and perspective view respectively of an optical ray-trace of the multijunction diode laser apparatus 1100 showing how the three multijunction diode lasers 1002 are spaced apart from each other vertically and horizontally such that the respective pairs of diode laser beams 1004a, 1004b associated with each diode laser 1002 are emitted in approximately the same respective planes. Each pair of beams 1004a, 1004b is collimated in the fast axis with fast axis collimators 1016 and collimated in the slow axis with slow axis collimators 1018.

Turning reflectors 1022a, 1022b, 1022c are each situated to receive a corresponding pair of collimated beams 1020a, 1020b. The pointing difference θ of corresponding pairs of collimated beams 1020a, 1020b need not be corrected by the reflectors 1022; rather, a focusing objective 1102 exploits the separation of beams 1020a, 1020b caused by this pointing difference to combine together the upper beams 1020a of each of the diode lasers 1002 and the lower beams 1020b of each of the diode lasers 1002, respectively, to fit all the beams within the aperture of a receiving optical fiber 1104, as will be explained more fully hereafter.

Figure 13:
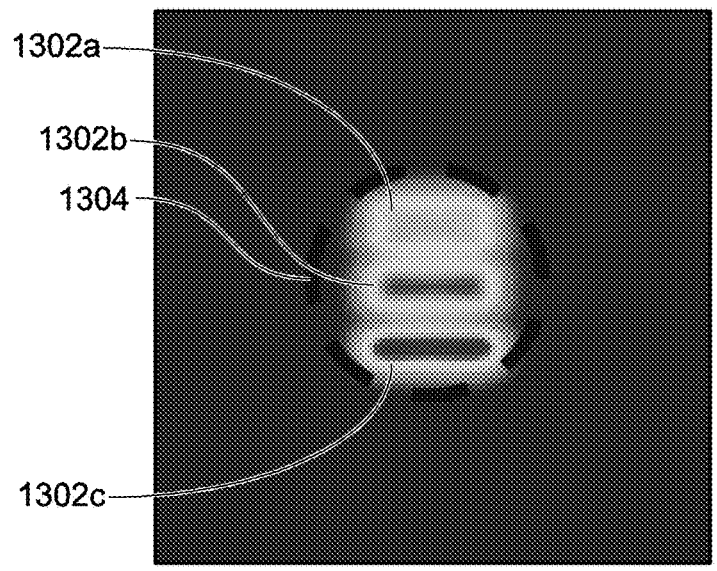
FIG. 13 is an optical intensity distribution map for three beams from bottom emitters of respective multijunction diode lasers of the apparatus of FIG. 10, taken at the aperture of an objective lens.

Referring now to FIG. 13, cross-sectional intensity distributions 1302a, 1302b and 1302c of bottom beams 1020b of each of the diode lasers 1002 taken at the front surface of 1106 of objective 1102 is shown. The separations Se between the diode laser apparatuses 1002a, 1002b and 1002c, and the distances from the mirrors 1022 to the front surface 1106, as shown in FIG. 11, are chosen so that at the front surface 1106 the intensity, i.e., irradiance, boundary of each of the beams fits within the objective aperture 1304 and the three bottom beams are essentially separated laterally from one another.

Figure 14:
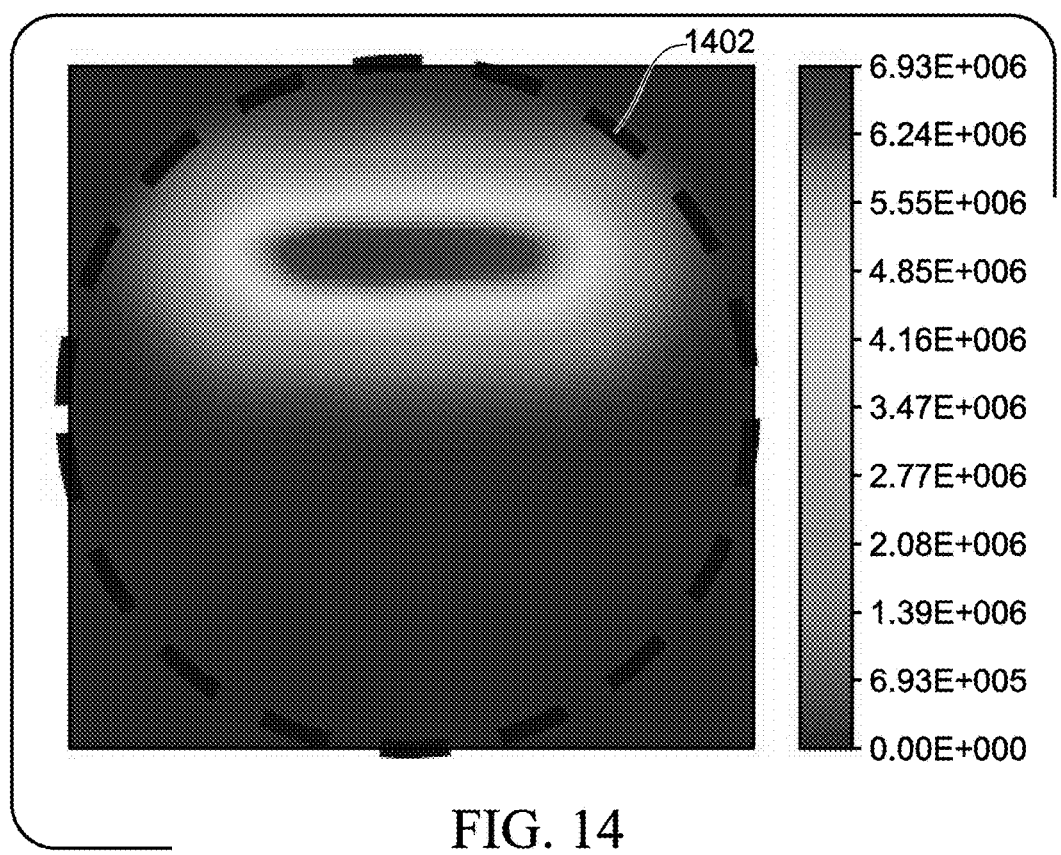
FIG. 14 is an optical intensity distribution map for the combined three beams of FIG. 13 taken at the circular aperture of an optical fiber.

Turning to FIG. 14, which shows optical intensity at the input aperture 1402 to optical fiber 1104, it can be seen that the pointing angle of the bottom beams 1020b as imaged through the objective 1102 produces a superposition of all three bottom beams 1020b that is offset to the top of the fiber input aperture 1402.

Figure 15:
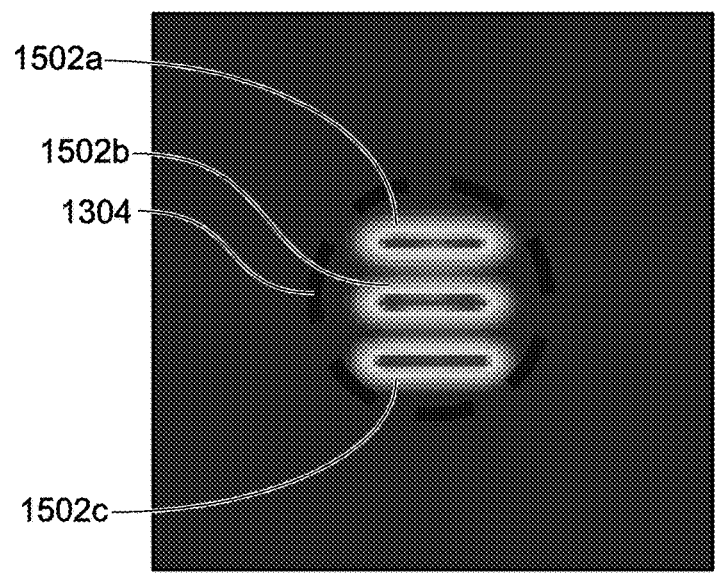
FIG. 15 is an optical intensity distribution map for three beams from top emitters of respective multijunction diode lasers of the apparatus of FIG. 10, taken at the aperture of the objective lens.
Figure 16:
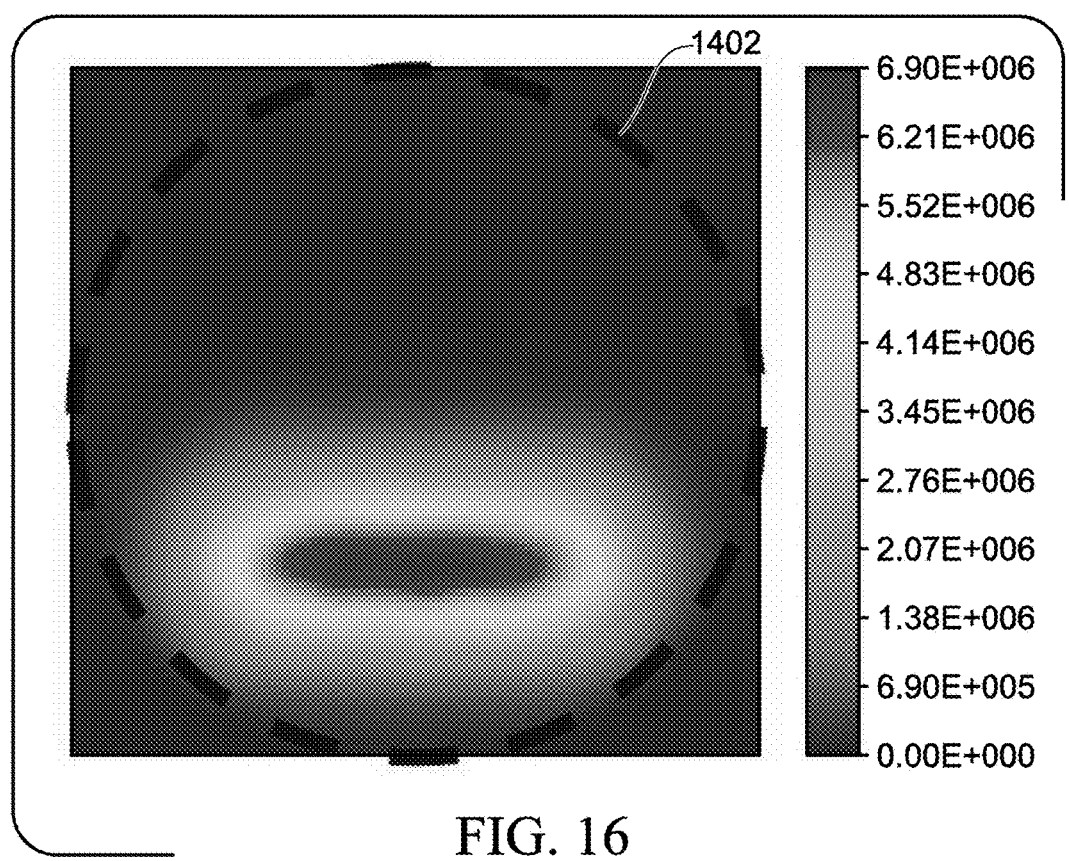
FIG. 16 is an optical intensity distribution map for the combined three beams of FIG. 15 taken at the circular aperture of the optical fiber.

Similarly, as shown in FIG. 15, the cross-sectional intensity distributions 1502a, 1502b and 1502c of top beams 1020a of each of the diode lasers 1002 taken at the front surface of 1106 of objective 1102 is shows that the irradiance, boundary of each of the beams fits within the objective aperture 1304 and the three top beams are essentially separated laterally from one another. Likewise FIG. 16 shows optical intensity of the top beams at the input aperture 1102 to optical fiber 1104. It can be seen that the pointing angle of the top beams 1020a as imaged through the objective 1102 produces a superposition of all three top beams 1020a that is offset to the bottom of the fiber input aperture 1304. Thus, essentially all of the power of the combined six emitters 908 of the three two-emitter laser diodes 1002 is imaged within the optical fiber aperture 1402 for efficient coupling of optical power from the emitters into the fiber.

Figure 17:
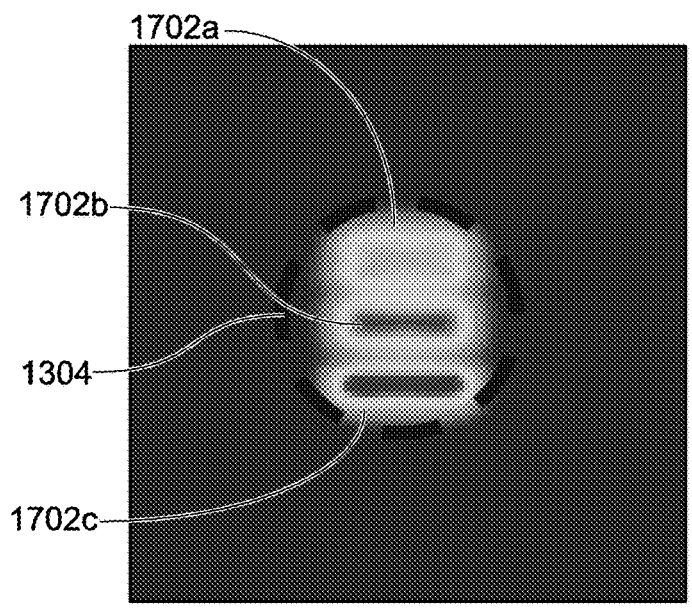
FIG. 17 is an optical intensity distribution map superimposing the combined three beams from bottom emitters of FIG. 14 and the combined three beams of top emitters of FIG. 16.

In FIG. 17 the superimposed intensity distributions 1702a, 1702b and 1702c show that the respective top 1020a and bottom 1020b beams for the diode laser apparatus 1002a furthest from the objective 1102 the individual beams are somewhat separated due to the pointing difference and the different propagation distances, thereby resulting in a relatively broad and less-concentrated distribution of the optical power 1702a. In contrast, for the laser apparatus 1002c closest to the objective 1102, the top 1070a and bottom 1020b beams are very close to one another, thereby resulting in a relatively concentrated power distribution. Thus, the diode laser apparatus 1002a furthest from the objective 1102 sets a limit on coupling the maximum available optical power into the fiber.

Figure 18:
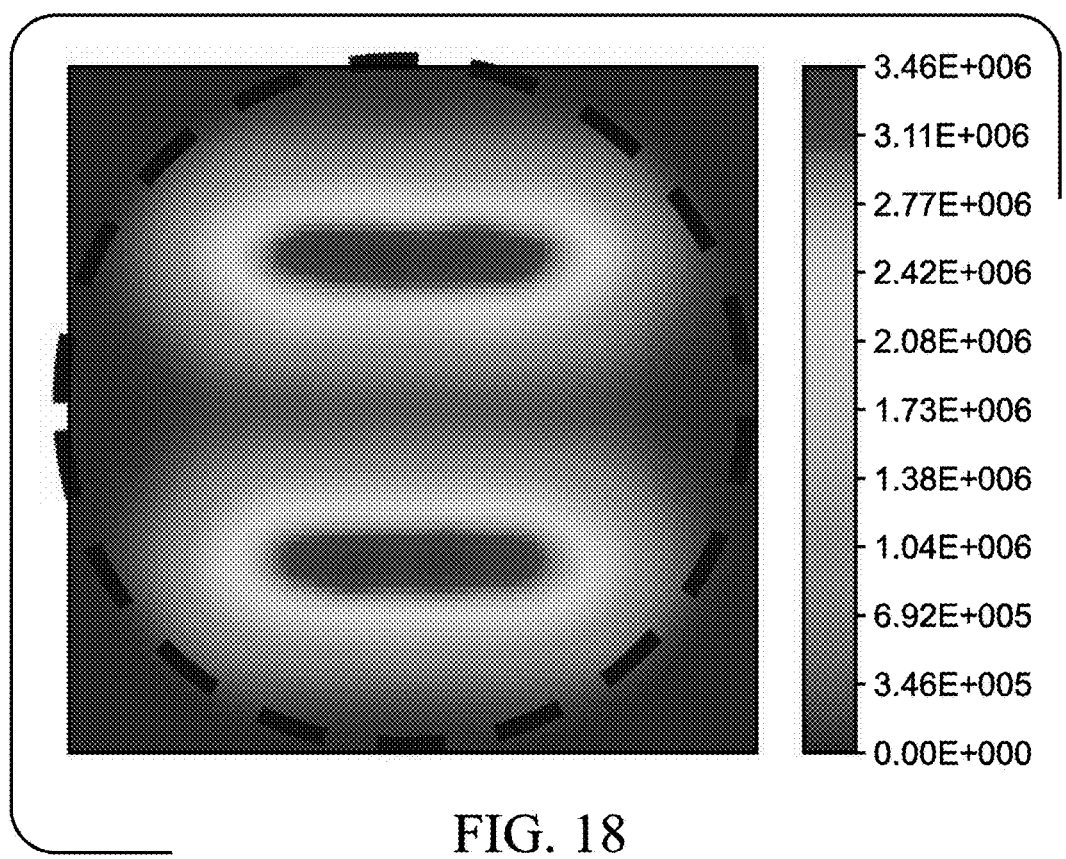
FIG. 18 is an optical intensity distribution map of both the combined beams shown in FIG. 14 and the combined beams shown in FIG. 16 positioned taken at the circular aperture of the optical fiber.

FIG. 18 shows optical intensity of both the top and bottom beams at the input aperture 1102 to optical fiber 1104.

Large Emitter Pitch, Beam Straightening Optics and Separate Optical Paths

Figure 19:
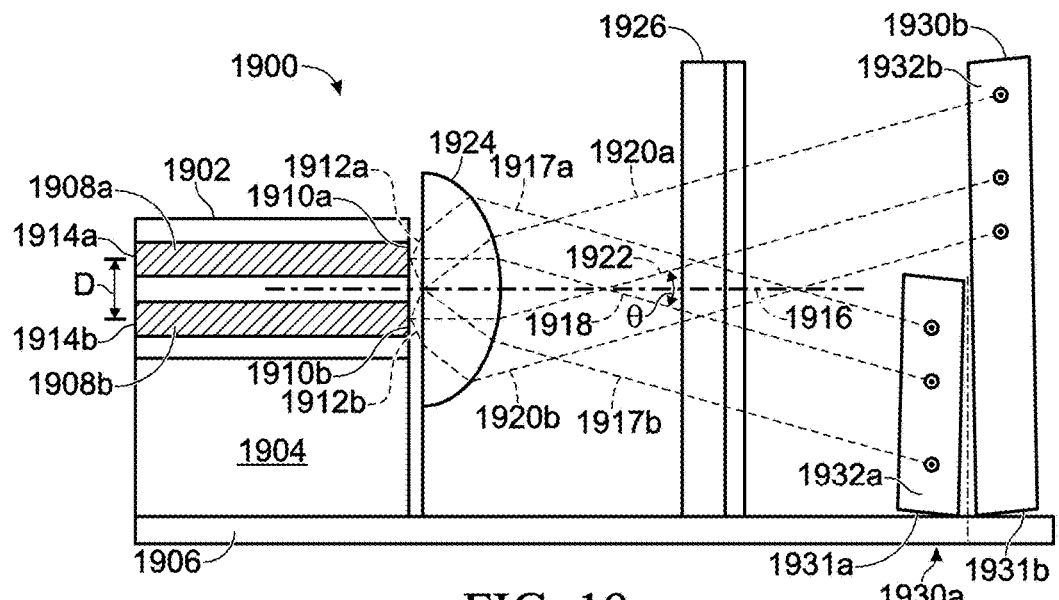
FIG. 19 is a schematic of a side view of a collimating portion of a further, fifth multijunction diode laser apparatus according to the present invention.

Turning now to FIG. 19, a fifth multijunction diode laser apparatus 1900 includes a multijunction diode laser 1902 mounted on a thermally conductive base 1904 which is secured to a thermally conductive housing 1906. The multijunction laser 1902, shown cross-sectionally, includes two active laser junctions 1908a, 1908b, each having associated output coupling facets 1910a, 1910b from which corresponding diode laser beams 1912a, 1912b are emitted during laser operation. Highly reflective rear facets (not shown) are oppositely disposed from the facets 1910 so as to form corresponding resonant cavities 1914a, 1914b from which the beams 1912 are generated. The distance between opposite facets generally defines the resonator and can be on the order of mm. The active junctions 1908 are offset from each other by a distance D of about 10 μm generally centered about a central emission axis 1916 so as to form a gap between junctions 908. The thickness of the cavities 1914, i.e., in the direction of the offset D, is generally in the range of about 1.5 μm. Due to the relatively small size, the direction associated with the offset D is associated with a fast axis of the corresponding emitted beams 1912a and 1912b. In some examples, active junctions can be gain-guided or index-guided.

In FIG. 19 the direction of the offset D is also on the order of microns and corresponds to a growth direction for the semiconductor laser 1902. Different methods may be used for semiconductor growth as may be known in the art, including metal-organic chemical vapor deposition. Hence, the multiple laser junctions 908 and offsets between junctions can be formed monolithically by growing different semiconductor layers, such as with GaAs, AlGaAs, InP, and various combinations thereof, with varying degrees of doping and structural contours to achieve desired output beam wavelengths, powers, waveguiding, or other laser or apparatus parameters. Electrical current is injected into the laser 1902 in the offset direction so as to power the active junctions 1908 which are disposed electrically in series.

In the foregoing respects, the fifth multijunction diode laser apparatus 1902 is generally similar to the multijunction diode laser apparatuses described above, except that the relatively large center-to-center separation D of about 10 μm enables the collimated beams to separate after a relatively short distance, as explained hereafter.

Emitted beam 1912a includes portions directed along a pair of opposite marginal axes 1917a, 1917b and a principal axis 1918 centered about a mid-plane of the resonant cavity 1914a. Emitted beam 1912b includes portions directed along a similar pair of opposite marginal axes 1920a, 1920b and a principal axis 1922 centered about a mid-plane of the resonant cavity 1914b. A fast axis collimation optic (FAC) 1924 is disposed in the optical path of the emitted beams 1912 and is situated to provide collimated outputs with respect to the fast axis of the beams, i.e., fast axis collimated beams. The effective focal length of the FAC optic 1924 is typically relatively short, such as in the range of 150 to 400 μm.

In contrast to the multijunction diode laser apparatus 100 shown in FIG. 1, in the multijunction diode laser apparatus 1900 the larger, 10 μm offset of the beams 1912 with respect to the fast axis provides the fast axis collimated beams with much greater pointing difference θ with respect to the emission axis 1916. This enables the collimated beams 1912a and 1912b to separate more rapidly, as shown in FIG. 19.

FAC optic 1924 is a plano-convex cylindrical lens, though it will be appreciated that bi-convex and other configurations are also suitable. A large pointing difference θ on the order of 10s of mrad is produced depending on the effective focal length of the FAC optic 924 and offset D between emitting facets 1910a, 1910b. By way of example, for a multijunction diode laser with about 10 μm pitch and about 1.5 μm emitting areas collimated to beam diameter of about 300 μm, the pointing difference may be as much as 30 mrad. Such beams are substantially separated from one another in a relatively short distance of about 9.6 mm. For purposes herein, a pointing difference of 25 mrad or greater is defined as being "maximal." Also for purposes herein, two Gaussian beams substantially separate, or have substantially separated, when their $1/e^2$ beam widths do not overlap.

The beams 1912a, 1912b have divergences that are less along a slow axis that is orthogonal to the fast axis than along the fast axis. The lesser divergences are generally associated with the larger width of the emitting facets 1910 and resonant cavities 1908 (i.e., a dimension into the plane of FIG. 9) which can be on the order of tens to hundreds of microns depending on the desired beam output characteristics. Because of the lesser divergences, a slow axis collimation (SAC) optic 1926 is typically disposed in the optical path of the emitted beams 1912 after the FAC optic 1924. As shown in FIG. 19, the SAC optic 1926 is a plano-convex cylindrical lens optic with an axis of curvature oriented orthogonally to the axis of curvature of the FAC optic 1924, i.e., into the plane of FIG. 19. Because the SAC optic 1926 collimates preferably only along the slow axis, the beams 1912a, 1912b typically are not redirected along the fast axis via propagation through the SAC optic 1926. Similarly, the beams 1912a, 1912b are not redirected along the slow axes by propagation through FAC optic 1924. For junctions 1908 stacked one above the other with offset D in the fast axis direction, beams 1912a, 1912b generally do not have pointing difference with respect to each other in the slow axis direction.

Reflectors 1930a, 1930b are disposed along the propagation path of the beams 1912a and 1912b, respectively, after the beams become spatially separated sufficiently along the beam fast axes such that the beams no longer substantially overlap. The reflectors 1930a, 1930b are situated with respective specular front surfaces 1932a, 1932b arranged at about 45° with respect to the incident transverse plane of the beams 1912 in order to reflect the beams at about 90°, i.e., out of the plane of FIG. 19. They are also offset along the principal axis 1918 so that respective beams reflected from those reflectors are offset in that direction from one another in order that they can be combined as explained below.

Adjacent reflectors 1930a, 1930b are adjusted to slightly different angles to compensate the pointing difference θ of the incident collimated beams 1912a, 1912b so that the collimated, reflected beams 1912 or principal axes 1918, 1922 are parallel to each other and to the parallel slow axes of the beams 1912a, 1912b emitted from the front facets 1910a, 1910b. The reflected parallel beams can have some tolerance error associated with the degree to which the beams are parallel, however such tolerance is less than the divergence associated with the incident beams. For example, a 7 mrad divergence angle can be corrected to be within about ±2 mrad after reflection.

A bottom surface 1931a of lower reflector 1930b can be secured with a UV curable epoxy to the housing 1906, and aligned by rotating and tilting the reflector 1930b prior to cure so that collimated beam 1912a is reflected perpendicularly and substantially parallel to the emitter facet 1910a or otherwise directed to a desired location on a focusing objective or coupling fiber (not shown). Likewise, the bottom surface 1931b of offset reflector 1930a can then be secured to the housing 1906 with UV curable epoxy and aligned by rotating and tilting the reflector 1930b so that collimated beam 1912b is reflected perpendicularly and parallel or substantially parallel to the reflected principal axis 1918 of beam 1912a. The alignment of the reflector surfaces 1932 for pointing correction of the beams 1912 provides a small angular difference between the reflector surfaces 1932.

Figure 20:
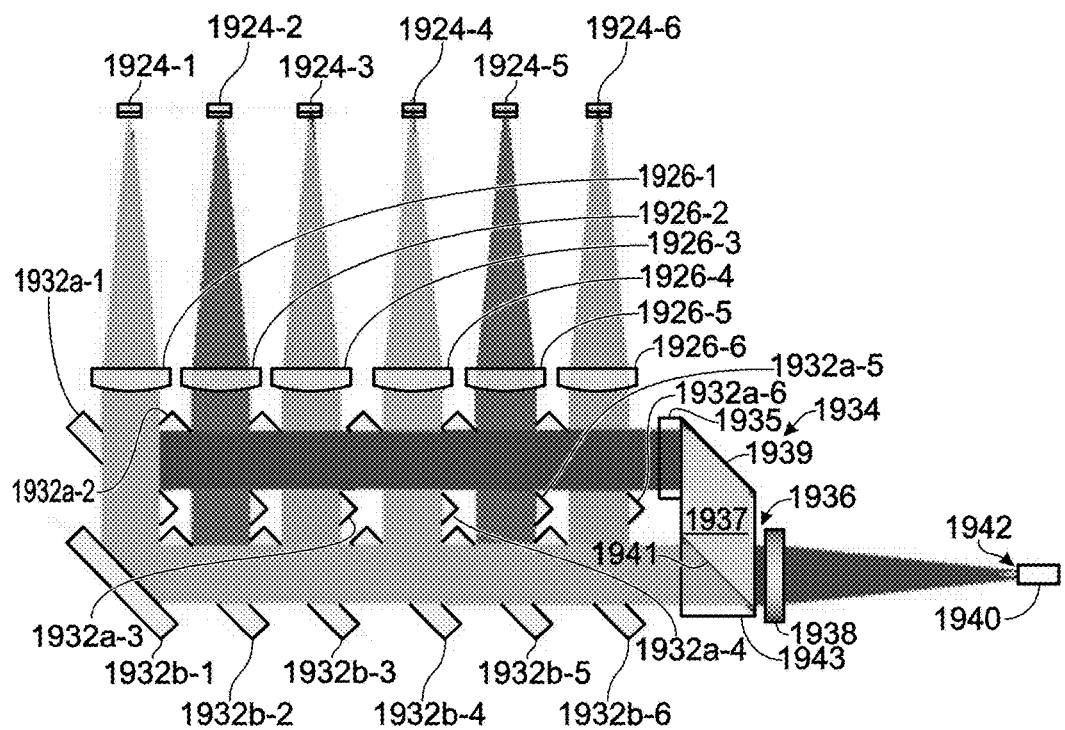
FIG. 20 is a schematic of a top view of the a multiple multijunction diode laser apparatus according to the present invention, employing six multijunction laser apparatus of the type shown in FIG. 19.
Figure 21:
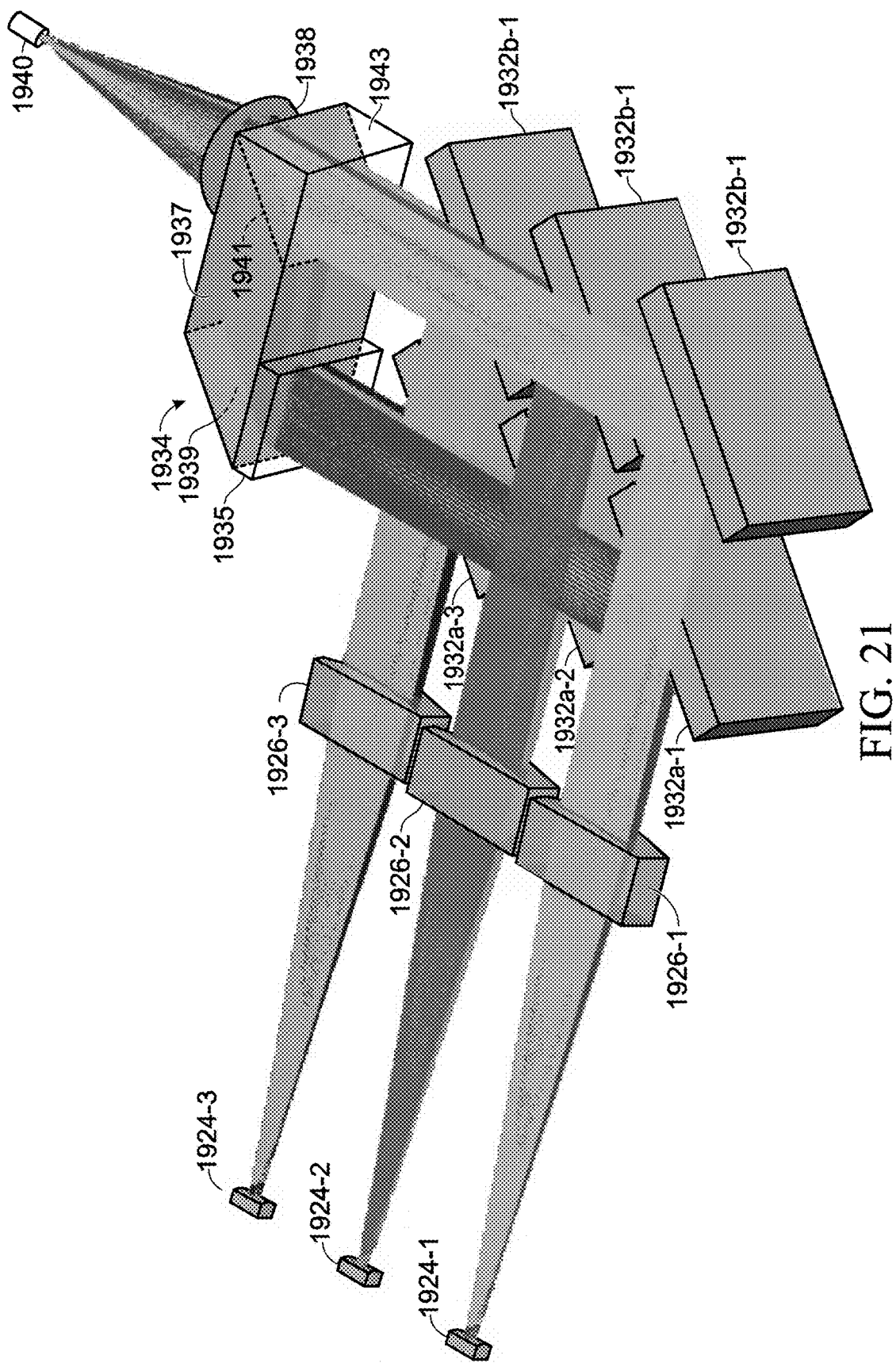
FIG. 21 is a perspective view of a top view of a ray trace for a three laser diode apparatus portion of the multiple multijunction diode laser apparatus of FIG. 20.
Figure 22:
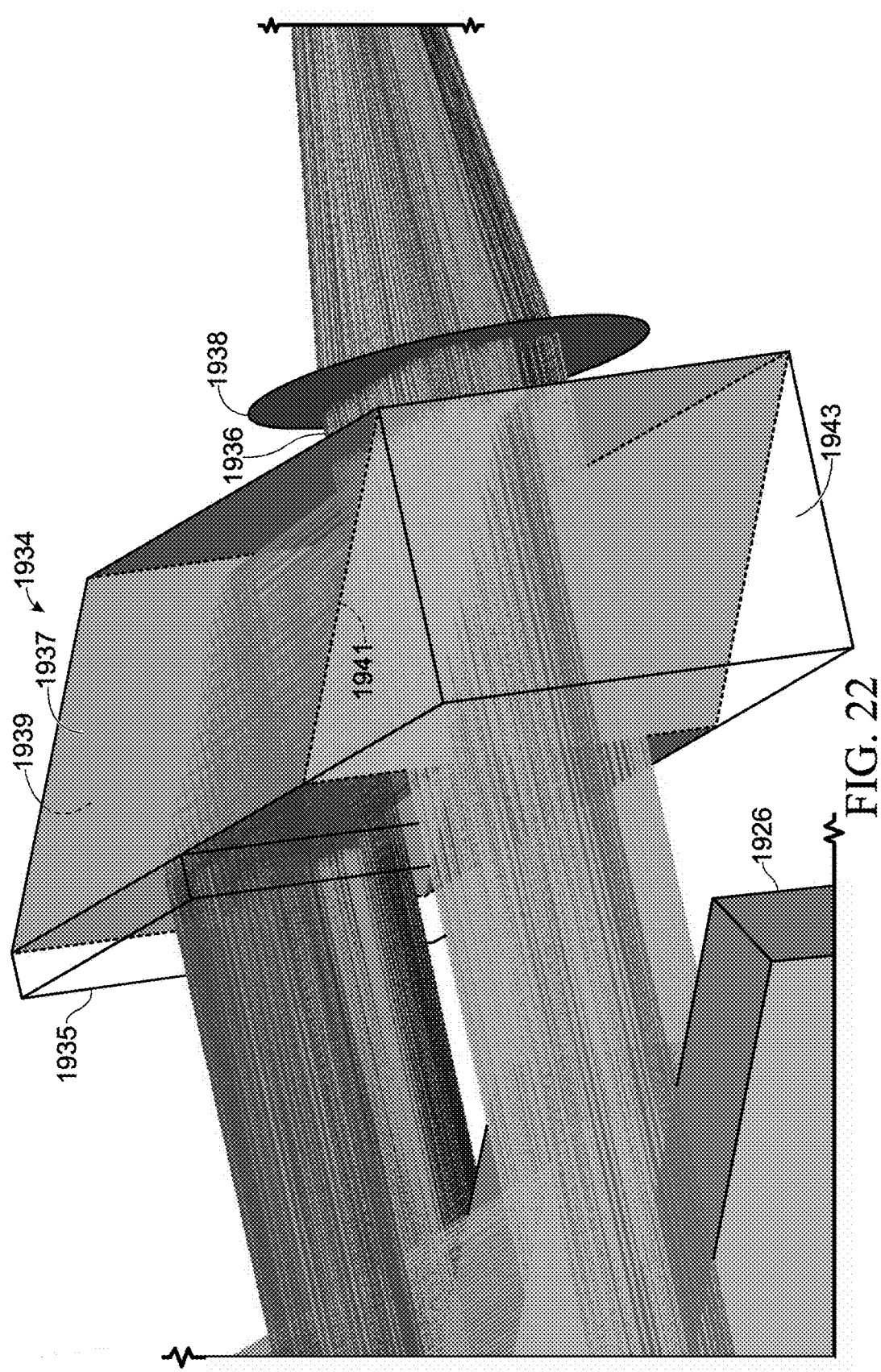
FIG. 22 is a perspective view of beam combiner and objective lens portion of the multiple multijunction diode laser apparatus of FIG. 20 or 21.

Referring now to FIG. 20, the collimated, reflected, and pointing-corrected beams 1912 for one or more sets of laser diodes 1902 and corresponding FACs 1924, SACs, and reflectors 1932a, 1932b are then received by a beam combiner 1934, which combines the beams from both emitters of all of the diodes into a single set of beams 1936 transmitted to an objective 1938 that focuses them within the entrance aperture 1942 of an optical fiber 1940. FIG. 20 shows six such laser diode, FAC, SAC and reflector sets, while a perspective view shown be FIG. 21 shows three such sets. It is to be understood that, like the three laser diode embodiment of FIG. 10, each subsequent set of laser diode 1902, FAC 1924, SAC 1926, reflector 1932a and reflector 1932b must be offset vertically from its predecessor in order to accommodate the their respective reflectors.

Figure 23:
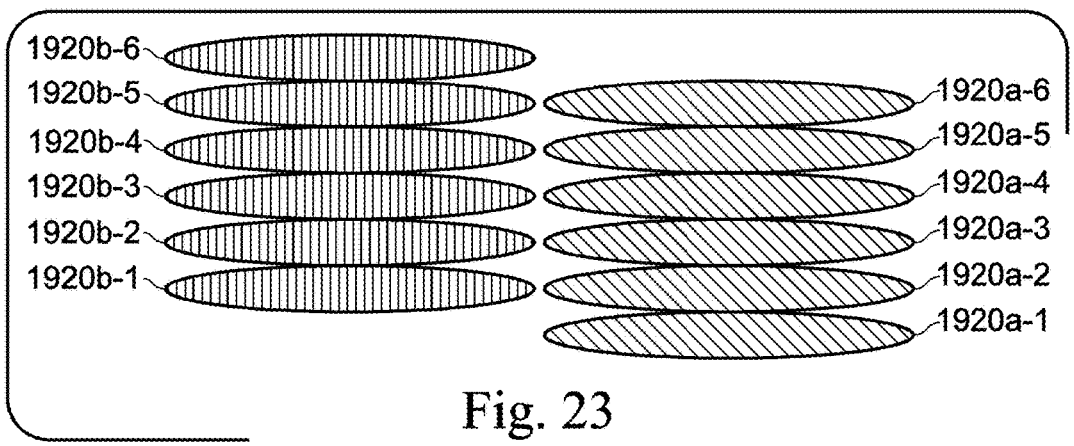
FIG. 23 is an illustration of the nominal power cross sections of two offset pairs of twelve beams to be combined by the beam combiner of FIG. 22.

As in the previous embodiments, the individual beams are asymmetrical in cross section, the horizontal, slow axis being longer and the vertical, fast axis being shorter. Accordingly, beams 1920b(1)-1920b(6) being shown in cross section on the left in FIG. 23 and the beams 1920a(1)-1920a(6) being shown in cross-section on the right. As will be understood by a person having ordinary skill in the art, a polarization multiplexer works as a beam combiner that will accept these two sets of upper and lower beams and combine them to spatially overlap. That is, the beam combiner comprises a polarization rotator 1935, a first prism 1937 having end surfaces 1939 and 1941, and a second prism 1943. Beams 1920a-1 through 1920a-6, which are substantially linearly polarized, propagate through polarization rotator 1935, which rotates their polarization 90 degrees before entering prism 1939. They are then reflected 90 degrees off surface 1939 toward surface 1941, where they are again reflected 90 degrees toward objective 1938. Prisms 1943 and 1937 ordinarily would have essentially the same index of refraction, so beams 1920b-1 through 1920b-6, which remain substantially linearly polarized in their original direction, propagate straight through the interface at surface 1941.

Figure 24:
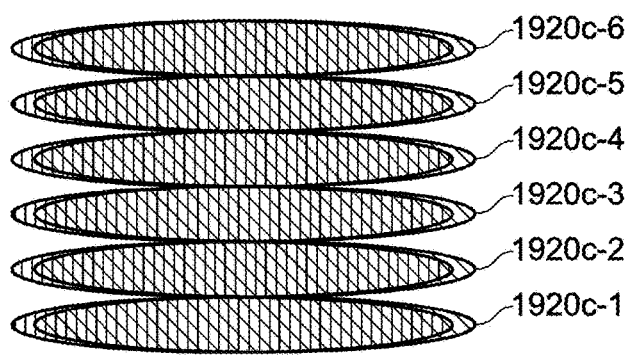
FIG. 24 is an illustration of the nominal power cross sections of the two pairs of twelve beams of FIG. 23 combined together at the output of the beam combiner of FIG. 22.
Figure 25:
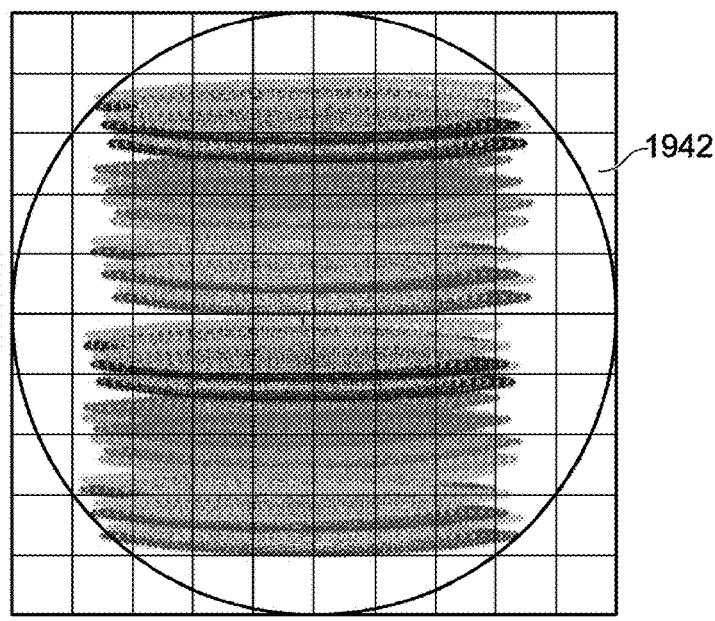
FIG. 25 is an illustration of the optical intensity distribution for the two offset pairs of twelve beams of FIG. 23 as combined in FIG. 24, taken at the aperture of an objective lens.

However, because of the vertical offset between 1920a(1)-1920a(6) and 1920b(1)-1920b(6), faces 1941 and 1942 are each tilted oppositely about a substantially horizontal axis to overlap all the beams into one set of vertically-offset beams 1920c(1)-1920c(6). This can be seen in FIG. 24, which shows the optical energy distribution at the front aperture of the objective 1938. These beams are then imaged by the objective into the circular aperture 1942 of the optical fiber 1940 with high optical efficiency, producing a combined energy distribution as shown in FIG. 25.

Figure 26:
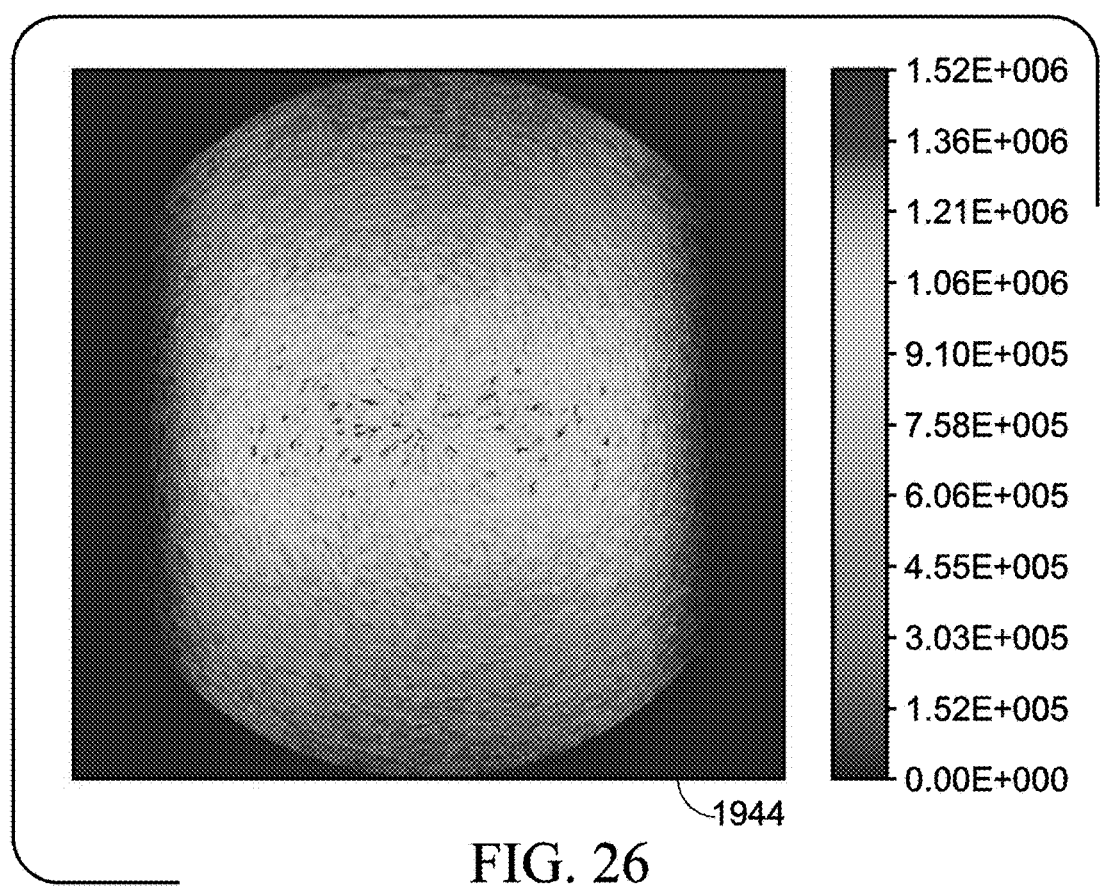
FIG. 26 is an optical intensity distribution map for the two offset pairs of twelve beams of FIG. 23 as combined in FIG. 24, taken at the aperture of an optical fiber.

The optical intensity distribution at the fiber aperture 1942 is shown in FIG. 26.

Figure 27:
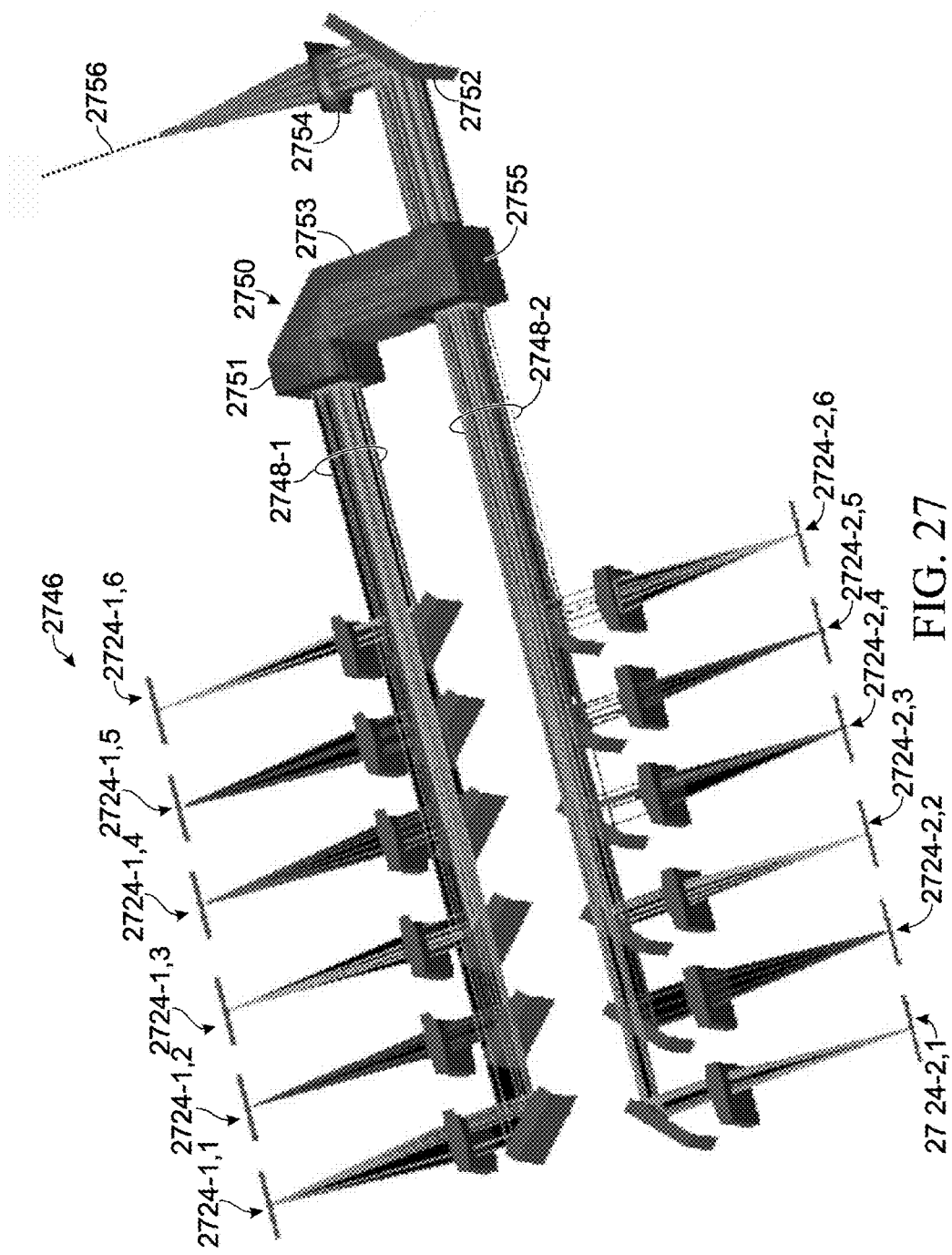
FIG. 27 is a perspective view of a variation of the multiple multijunction laser apparatus of FIG. 20 according to the present invention.

FIG. 27 shows a variation 2746 of the multiple multijunction diode laser apparatus 1100 wherein two sets of six multijunction laser apparatus lens and mirror sets 2724-1, 1-2724(1,6) and 2724-2,1-2724(2,6) are employed on opposite sides of the apparatus, and wherein their respective beams 27481, 1948-2 are combined by a beam combiner 2750, having a polarization rotator 2751, a first prism 2753 and a second prism 2755 into one set of overlapping beams steered by mirror 1952 toward objective 1954 into the aperture of an optical fiber 1956 to achieve essentially twice the power output of the laser apparatus 1902.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

The invention claimed is:

1. An apparatus, comprising: a first multijunction diode laser comprising a plurality of stacked active junctions spaced apart from one another, said first multijunction diode laser being situated to emit a first pair of beams along respective first parallel propagation axes, the beams of the first pair of beams having first respectively parallel slow axes and a first common fast axis; a first fast axis collimator situated to receive and collimate the first pair of beams along their common fast axis so as to produce a corresponding pair of first fast axis collimated beams that propagate along first respective non-parallel propagation axes; and a first reflector situated to receive and reflect the first pair of fast axis collimated beams so that the reflected beams propagate along altered first respective non-parallel axes in a new direction, wherein the beams of the first pair of fast axis collimated beams substantially overlap in the first common fast axis at the first reflector.

2. The apparatus of claim 1, further comprising at least one slow axis collimator situated between the first fast axis collimator and the first reflector to receive and collimate the first pair of beams in their respective slow axes.

3. The apparatus of claim 1, wherein upon reflection of the first pair of beams by the first reflector the beams have a pointing difference substantially the same as before being reflected and a substantially common fast axis.

4. The apparatus of claim 3, further comprising an objective situated with respect to the first reflector so as to receive and focus the beams of the first pair of beams at a substantially common focal plane.

5. The apparatus of claim 4, wherein images of each of the beams of the first pair of beams are produced by the objective substantially within the optical aperture of an optical fiber.

6. The apparatus of claim 3, further comprising: a second multijunction diode laser comprising a plurality of stacked active junctions spaced apart from one another, said first multijunction diode laser being situated to emit a second pair of beams along respective second parallel propagation axes, the beams of the second pair of beams having second respectively parallel slow axes and a second common fast axis; a second fast axis collimator situated to receive and collimate the second pair of beams along their common fast axis so as to produce corresponding pair of second fast axis collimated beams that propagate along second respective non-parallel propagation axes; a second reflector situated to receive and reflect the second pair of fast axis collimated beams so that the reflected beams propagate along altered second respective non-parallel propagation axes in said new direction; and at least one slow axis collimator situated between the first fast axis collimator and the first reflector to receive and collimate the first pair of beams in their respective slow axes, wherein the beams of the second pair of fast axis collimated beams substantially overlap in the common fast axis at the second reflector and upon reflection the beams of the second pair of beams have substantially the same fast axis as the first pair of beams.

7. The apparatus of claim 6, further comprising an objective situated with respect to the first reflector and the second reflector to receive and focus the first and second pairs of beams at a substantially common focal plane.

8. The apparatus of claim 7, wherein images of each of the beams of the first pair of beams and the second pair of beams are produced by the objective substantially within an entrance aperture of the core of an optical fiber.

9. The apparatus of claim 8, wherein beams from corresponding emitters of said first laser diode and said second laser diode substantially overlap within said entrance aperture.

10. A method, comprising: causing a first pair of beams to be emitted from a first multijunction diode laser along respective first parallel propagation axes, the first multijunction diode laser comprising a plurality of stacked active junctions spaced apart from one another, the beams of the first pair of beams having first respectively parallel slow axes and a first common fast axis; causing the beams of the first pair of beams to be collimated along their common fast axis at a first fast-axis collimation location so as to produce a corresponding pair of first fast axis collimated beams that propagate along first respective non-parallel propagation axes; and causing the first pair of fast axis collimated beams to be reflected at a first reflection location so that the reflected beams propagate along altered first respective non-parallel propagation axes in a new direction, wherein the beams of the first pair of fast axis collimated beams substantially overlap in the first common fast axis at the first reflection location.

11. The method of claim 10, further comprising: causing a second pair of beams to be emitted from a second multijunction diode laser along respective second parallel propagation axes, the second multijunction diode laser comprising a plurality of stacked active junctions spaced apart from one another, the beams of the second pair of beams having second respectively parallel slow axes and a second common fast axis; causing the beams of the second pair of beams to be collimated along their common fast axis at a second fast-axis collimation location so as to produce a corresponding pair of second fast axis collimated beams that propagate along respective second non-parallel propagation axes; causing the second pair of fast axis collimated beams to be reflected at a second reflection location so that the reflected beams propagate along altered second respective non-parallel propagation axes in said new direction wherein the beams of the second pair of fast axis collimated beams substantially overlap in the second common fast axis at the second reflection location; and causing the beams of the second pair of beams to be collimated along their respective slow axes at a location between the second fast-axis collimation location and the second reflection location.

12. An apparatus, comprising: a first multijunction diode laser comprising a plurality of stacked active junctions spaced apart from one another, said first multijunction diode laser being situated to emit a first pair of beams along respective first parallel propagation axes, the beams of the first pair of beams having first respectively parallel slow axes and a first common fast axis; a first fast axis collimator situated to receive and collimate the first pair of beams along their common fast axis so as to produce a corresponding first pair of first substantially separated fast axis collimated beams that propagate along first respective non-parallel propagation axes; at least one first reflector situated to receive and reflect one beam of the first pair of fast axis collimated beams so as to propagate in a new direction while allowing another beam of the first pair of beams to pass thereby; and another first reflector situated to receive and reflect the other beam of the first pair of beams so as to propagate in the same new direction as the one beam, the resulting fast axes of the beams of the first pair of beams being separate but substantially parallel to one another, wherein the one beam and the other beam have a substantial pointing difference just prior to reflection by the one first reflector and the other first reflector respectively, but are rendered substantially parallel to one another upon reflection of both beams.

13. The apparatus of claim 12, further comprising a beam combiner for receiving the one and the other of the beams of the first pair of beams and combining them so as to have substantially the same fast and slow axes.

14. The apparatus of claim 13, further comprising an objective situated with respect to the beam combiner so as to receive and focus the one beam and the other beam of the first pair of beams at a substantially common focal plane.

15. The apparatus of claim 13, wherein the beam combiner comprises a first prism having top and bottom faces, substantially parallel front and back faces, a first end face oblique to both the top face and the front face, and a second end face parallel to the first end face, and a second prism having top and bottom faces, a front face, a first end face oblique to the top face and the front face, and a second end face, so that when the first end face of the second prism is placed against the second end face of the first prism it foams a prism interface and the front face of the second prism is substantially parallel to the front face of the first prism.

16. The apparatus of claim 15, wherein the beam combiner is situated with respect to the one reflector and other reflector of the first diode laser so that the one beam of the first pair of beams enters the front face of the second prism, propagates through the prism interface and exits from the back face of the first prism, and the other beam of the first pair of beams enters the front face of the beam combiner, is reflected by the first end face of the first prism toward the prism interface, and is reflected by the prism interface so as to combine with and have substantially the same fast and slow axes as the one beam of the first pair of beams.

17. The apparatus of claim 13, further comprising: a second multijunction diode laser comprising a plurality of stacked active junctions spaced apart from one another, said second multijunction diode laser being situated to emit a second pair of beams along respective second parallel propagation axes, the beams of the second pair of beams having second respective parallel slow axes and a second common fast axis; a second fast axis collimator situated to receive and collimate the second pair of beams along their common fast axis so as to produce a corresponding pair of second substantially separated fast axis collimated beams that propagate along second respective non-parallel propagation axes; at least one second reflector situated to receive and reflect one beam of the second pair of beams so as to propagate in a new direction while allowing the other beam of the second pair of beams to pass thereby; and another second reflector situated to receive and reflect the other beam of the second pair of beams so as to propagate in the same new direction as the one beam of the second pair of beams, the resulting fast axes of the second pair of beams being separate but substantially parallel to one another, wherein the one beam of the second pair of beams and the other beam of the second pair of beams have a substantial pointing difference just prior to reflection by the one second reflector and the other second reflector respectively, but are rendered substantially parallel to one another upon reflection by both beams; said beam combiner also receiving and combining the one beam of the second pair of beams and the other beam of the second pair of beams, respectively, with the one beam of the first pair of beams and the other beam of the second pair of beams so as to have substantially the same respective fast and slow axes.

18. The apparatus of claim 17, further comprising an objective situated with respect to the beam combiner so as to receive and focus the first beam of the first pair of beams and the second beam of the second pair of beams at a substantially common focal plane.

19. The apparatus of claim 18, wherein said substantially common focal plane is the location of the entrance aperture of the core of an optical fiber, and wherein images of the beams of the first and second pairs of beams are focused at separate locations substantially within said entrance aperture.

* * * * *